(12) United States Patent
Wang et al.

(10) Patent No.: US 8,698,579 B2
(45) Date of Patent: Apr. 15, 2014

(54) MULTI-PHASE EMI NOISE SEPARATOR

(75) Inventors: Shuo Wang, San Antonio, TX (US);
Fred C. Lee, Blacksburg, VA (US)

(73) Assignee: Virginia Tech Intellectual Properties, Inc., Blacksburg, VA (US)

( * ) Notice: Subject to any disclaimer, the term of this patent is extended or adjusted under 35 U.S.C. 154(b) by 385 days.

(21) Appl. No.: 13/071,647

(22) Filed: Mar. 25, 2011

(65) Prior Publication Data

US 2011/0241799 A1    Oct. 6, 2011

Related U.S. Application Data

(60) Provisional application No. 61/319,326, filed on Mar. 31, 2010.

(51) Int. Cl.
*H03H 7/00* (2006.01)
*H04B 3/28* (2006.01)

(52) U.S. Cl.
USPC .......................................... 333/181; 333/12

(58) Field of Classification Search
USPC .................. 333/12, 181; 363/39, 47–48
See application file for complete search history.

(56) References Cited

U.S. PATENT DOCUMENTS

| | | | |
|---|---|---|---|
| 6,950,006 B1 * | 9/2005 | Shikama et al. | 336/200 |
| 7,453,331 B2 * | 11/2008 | Engelage | 333/181 |
| 7,561,008 B2 * | 7/2009 | Lucas | 333/181 |
| 2009/0201101 A1 * | 8/2009 | Kossel et al. | 333/174 |

OTHER PUBLICATIONS

Mutual Inductance; http://www.electronics-tutorials.ws; Oct. 11, 2009.*
Wang et al.; "Characterization, Evaluation, and Design of Noise Separator for Conducted EMI Noise Diagnosis"; IEEE Transactions on Power Electronics, vol. 20, No. 4, Jul. 2005, pp. 974-982.

* cited by examiner

*Primary Examiner* — Benny Lee
*Assistant Examiner* — Rakesh Patel
(74) *Attorney, Agent, or Firm* — Whitham, Curtis, Christofferson & Cook, P.C.

(57) ABSTRACT

Common mode (CM) and differential mode (DM) components of multi-phase conducted electromagnetic interference (EMI) noise emanating from electronic circuits such as power converters/inverters are separated by respective coupled inductors connected to each phase of three or more phases and which are coupled to each other differently for CM and DM noise of the respective phases. The inductors of the DM separation unit are coupled such that a substantially ideal zero impedance is presented to DM noise while a high impedance is presented to CM noise. Conversely, the inductors of the CM separation unit are coupled such that a substantially ideal zero impedance is presented to CM noise while a high impedance is presented to DM noise.

16 Claims, 22 Drawing Sheets

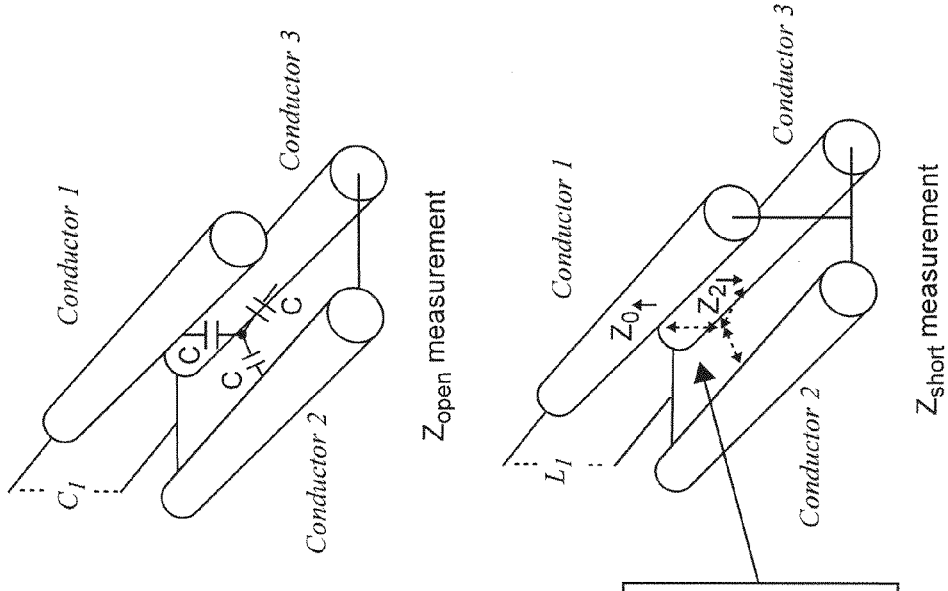
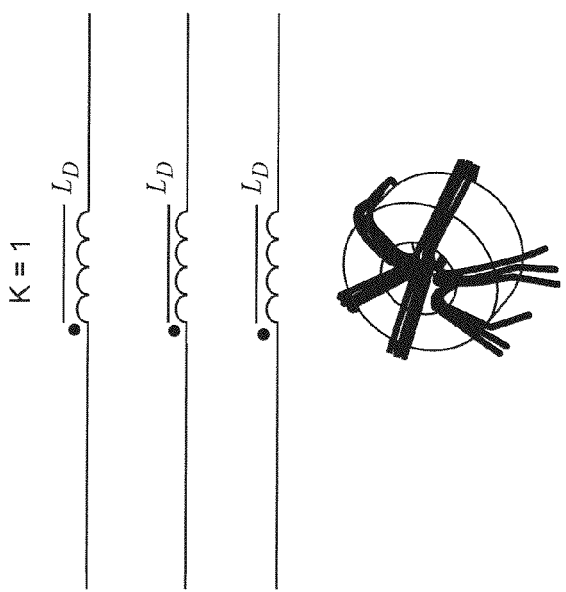
*Figure 9B*
*Figure 9C*

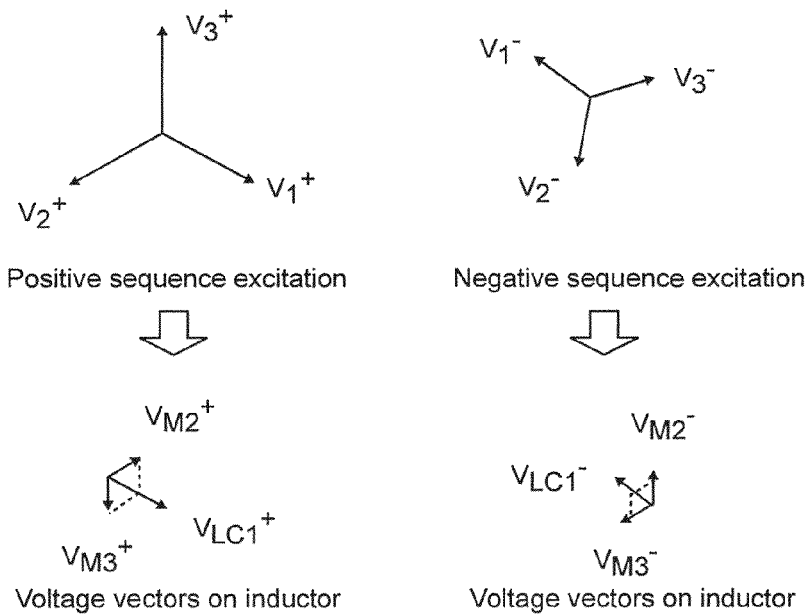
Figure 13A
Figure 13B
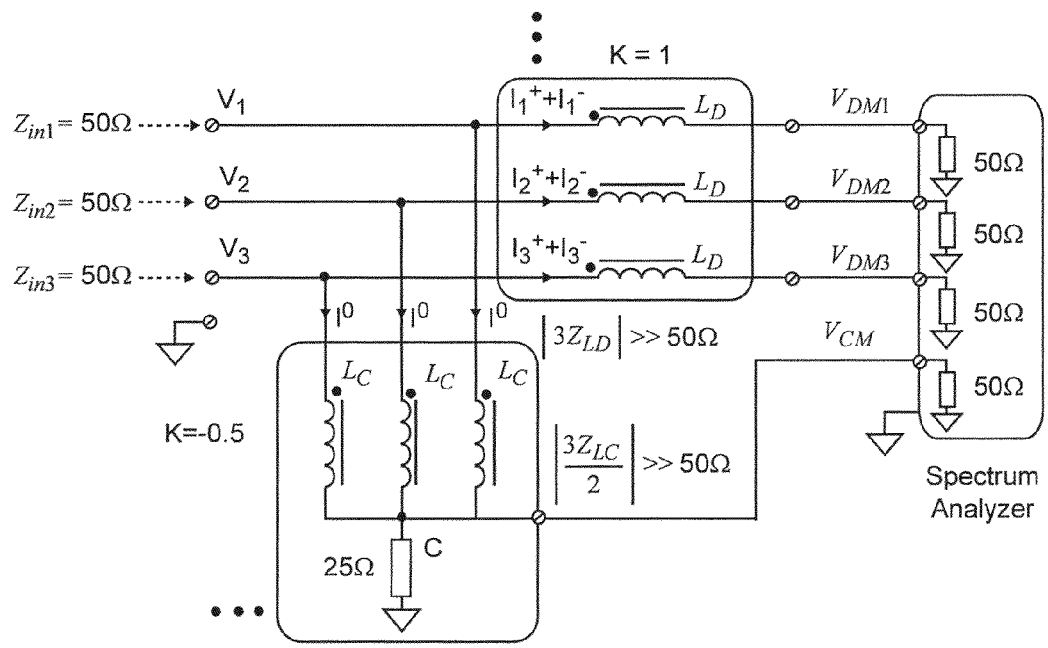
Figure 14

MULTI-PHASE EMI NOISE SEPARATOR

CROSS-REFERENCE TO RELATED APPLICATIONS

This application claims priority of U.S. Provisional Patent Application Ser. No. 61/319,326, filed Mar. 31, 2010, and which is hereby fully incorporated by reference.

FIELD OF THE INVENTION

The present invention generally relates to a method and circuit for separating common mode (CM) noise and differential mode (DM) noise emanating from an electronic circuit having multi-phase power input for direct measurement, and more particularly, to direct measurement of CM and DM noise emanating from a multi-phase electronic circuits and voltage regulator or converter circuits in particular, to facilitate design of suitable filter circuits for use therewith.

BACKGROUND OF THE INVENTION

Many commercially available electronic devices for communication, data processing, automatic control, aviation systems, space systems and the like require power in the form of a substantially constant voltage which can be supplied from a battery or through a regulated or unregulated power supply, often referred to as a voltage converter or power converter. While analog voltage regulator circuits have long been known, they are generally of low efficiency when significant currents are delivered since a voltage drop necessarily occurs across them, consuming power which must then be dissipated, generally as heat.

To improve efficiency, numerous switched power converter/inverter and voltage regulator topologies have been developed in recent years which use switches to intermittently provide power (which may or may not be smoothed by circuits including one or more inductors) to one or more filter stages, generally embodied with capacitors which can reduce ripple voltage magnitude to acceptable levels. Switched or switching power supplies are more efficient than analog voltage regulators since only nominal voltages are developed across the switches when conductive and only small or negligible currents are carried by the switches when nominally non-conductive. The voltage can be regulated over a wide range of voltages and load currents by varying the switching frequency or duty cycle of the input power.

However, in switched power supplies, to limit ripple voltage and to accommodate potentially large load transients, switching frequencies are generally high; usually in the range of several hundred KHz to several MHZ. Therefore, current and, sometimes, voltage transients may be large, particularly where the load current is high and/or where the voltage difference from input to output of the switched voltage regulator is large. Accordingly, switched voltage regulators can generate significant amounts of electromagnetic interference (EMI) noise having both common mode (CM) and differential mode (DM) components which may be radiated and/or reflected to the input and ultimately to the power source which may be the public power distribution grid from which it may be transmitted or conducted to other similarly connected devices. Therefore, the magnitude of EMI noise generated by a switched power supply (and any load connected to it) must be minimized and regulated to acceptably low levels, usually by the application of filters.

For high power applications, multi-phase power supplies have become very popular since the required load current can be satisfied by respective switched power supplies of a plurality of overlapping phases such that current requirements of any single phase can be reduced (and the cost of components thereof reduced accordingly). However, because of the high currents, large current ripples, high dv/dt and large parasitic parameters in multi-phase power electronics systems, the EMI noise is difficult to control. The size of the EMI filters which must be applied to each respective phase can be significant and may constitute up to half the volume of the entire power electronics system. Conventionally, EMI noise for a single phase AC or DC power supply can be substantially decoupled into its CM and DM components and CM and DM filters applied to suppress the CM and DM noise, respectively, once the characteristics (e.g. magnitude and spectrum) of the CM and DM noise are known. One approach to optimizing filter design so that the physical size of the filter can be minimized would ordinarily be to design the filter(s) based on measured EMI noise. However, conventional measurement methods cannot differentiate between CM and DM noise components. Therefore, conventional EMI noise measurements do not provide sufficiently accurate data to be effective for optimal filter design. Further, while a technique for separating DM and CM components of EMI noise for a single-phase voltage converter or power supply has been developed, separation of CM and DM noise components is very much more difficult and complex for a multi-phase application due to potential imbalance between phases and coupling and other interactions between phases that are electrically connected, at least at the common input power source. To date, no technique or circuit exists for separating CM and DM EMI noise components to provide sufficiently independent measurement of CM and DM noise components in a multi-phase application or for a device operating from multi-phase AC or DC power supplies to support optimal EMI noise filter design.

SUMMARY OF THE INVENTION

It is therefore an object of the present invention to provide a generalized characterization and analysis of requirements for multi-phase CM and DM noise separators using network theory and a corresponding design for a practical three-phase CM and DM noise separator that can be extended to any number of phases; the effectiveness of which has been experimentally verified and used in a practical three-phase power electronics system.

In order to accomplish these and other objects of the invention, a multi-phase noise separator capable of substantially separating common mode (CM) and differential mode (DM) noise components, said noise separator is provided comprising a CM noise separation unit capable of developing a high input impedance to DM noise components on connections of at least three different phases, and a DM noise separation unit capable of developing a high input impedance to CM noise components on connections of at least three different phases wherein inputs of said CM separation unit and said DM separation unit are connected in parallel. The invention provides such different impedances to different components of EMI noise through use of coupled inductors which have windings connected to the respective phases and which are coupled differently to present different impedances to the respective CM and DM noise components. The invention also comprehends practical designs for inductors having such properties as well as near ideal coupling coefficients.

BRIEF DESCRIPTION OF THE DRAWINGS

The foregoing and other objects, aspects and advantages will be better understood from the following detailed description of a preferred embodiment of the invention with reference to the drawings, in which:

FIG. 9B illustrates an exemplary embodiment of windings on a core suitable for performing DM noise separation, FIG. 9C illustrates a technique of adjusting characteristic impedance of the trifilar winding structure preferred for the embodiment of FIG. 9B, FIGS. 13A and 13B are voltage vector diagrams for the exemplary phase-1 inductor of FIG. 11 with positive and negative sequence excitations, FIG. 14 is a schematic diagram of a three-phase noise separator in accordance with the invention.

DETAILED DESCRIPTION OF A PREFERRED EMBODIMENT OF THE INVENTION

Figure 1:
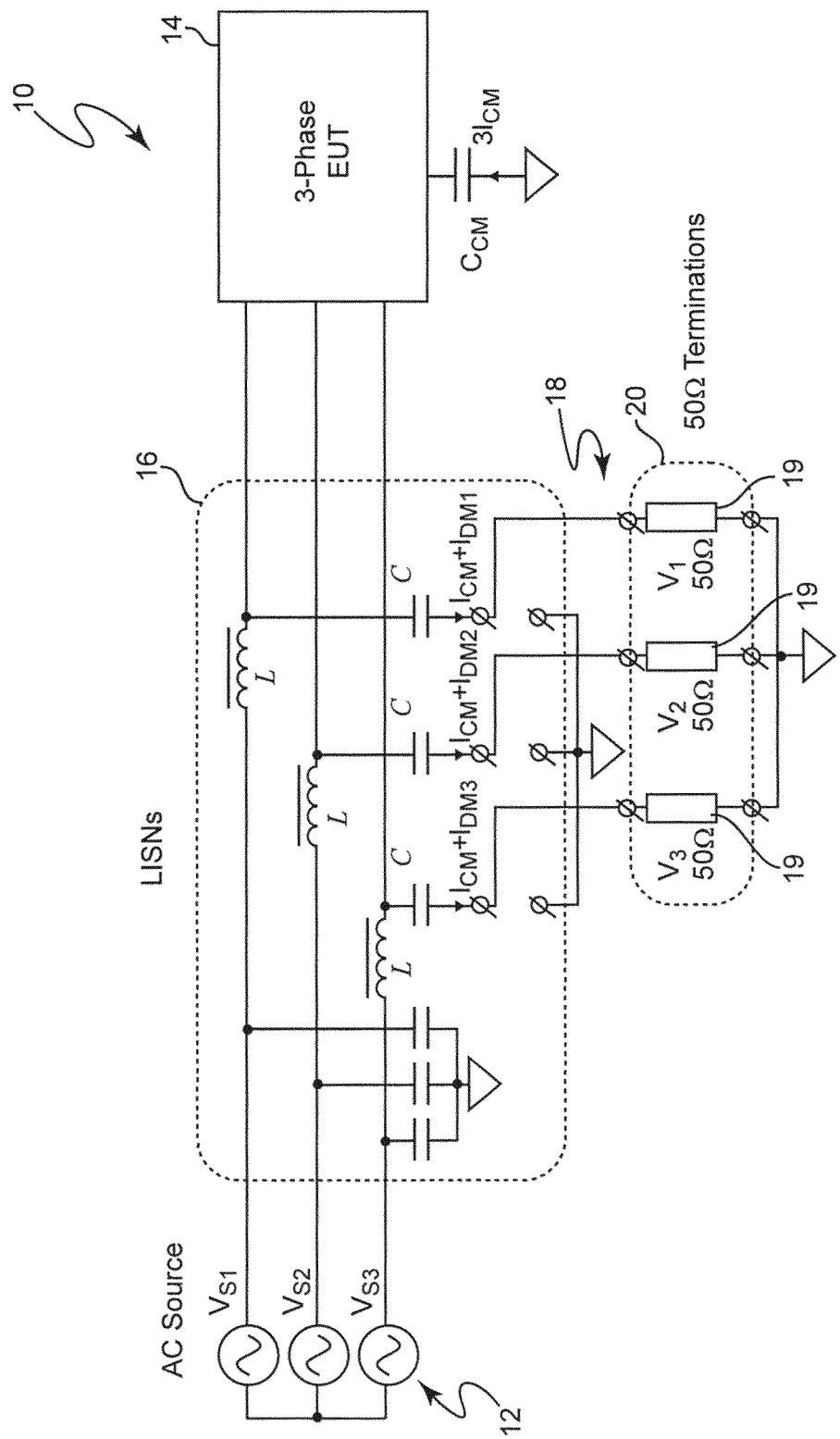
FIG. 1 is a schematic diagram of an idealized EMI noise measurement set up for a three-phase power electronics system.

Referring now to the drawings, and more particularly to FIG. 1, there is shown a high-level schematic diagram of an idealized EMI noise set up for a three-phase power electronics system. It is to be understood that, while the invention will be explained below with reference to a three-phase power electronics system, the invention can be extended to any number of phases in accordance with the generalization of the analysis and characterization of a three-phase system which is provided. The invention also is not limited to multi-phase power electronics systems but may be used in the context of any electronics device such as measurement of signal imbalance in signal and communication devices and systems.

In the EMI noise measurement set up 10 illustrated in FIG. 1, an exemplary three-phase array of alternating current voltage sources 12 is shown for an element under test (EUT) 14 having provision for input of three-phase power and with line impedance stabilizing networks (LISNs) 16 for respective phases of input power interposed therebetween. The LISNs 16 provide outputs 18 for the respective phases which are connected to 50Ω terminations 19 which may form elements of the respective LISNs or be connected to 50Ω inputs of a measurement device such as a spectrum analyzer, schematically indicated at 20.

When EUT 14 is in operation, parasitic capacitances, especially parasitic capacitance $C_{CM}$ between the nodes where voltage may change rapidly (e.g. high dv/dt nodes) and ground offer paths for CM noise. The CM noise, $3I_{CM}$, is reflected into the system through the 50Ω terminations 19 and LISNs 16. DM noise $I_{DM1}$, $I_{DM2}$ and $I_{DM3}$ also flow through the LISNs and 50Ω terminations, as illustrated. The CM and DM voltage drops on a 50Ω resistance (such as a termination 19) are defined as the CM or DM noise voltages. The noise voltage drops $V_1$, $V_2$ and $V_3$ on respective terminations 19 are thus defined as the total noise on the respective phases. The total noise in each respective phase is thus the vector sum of the CM and DM noise in the respective phases. The CM and DM noise voltages may be calculated from equations 1, 2, 3 and 4, as follows:

$$|V_{CM}| = \left|\frac{V_1 + V_2 + V_3}{3}\right| = 50|i_{CM}|, \tag{1}$$

$$|V_{DM1}| = |V_1 - V_{CM}| = \left|\frac{2V_1 - V_2 - V_3}{3}\right| = 50|i_{DM1}|, \tag{2}$$

-continued $$|V_{DM2}| = |V_2 - V_{CM}| = \left|\frac{2V_2 - V_1 - V_3}{3}\right| = 50|i_{DM2}|, \quad (3)$$

$$|V_{DM3}| = |V_3 - V_{CM}| = \left|\frac{2V_3 - V_1 - V_2}{3}\right| = 50|i_{DM3}|. \quad (4)$$

but it should be appreciated that the circuit of FIG. 1 does not provide for separation of CM and DM voltages for direct measurement.

Figure 2:
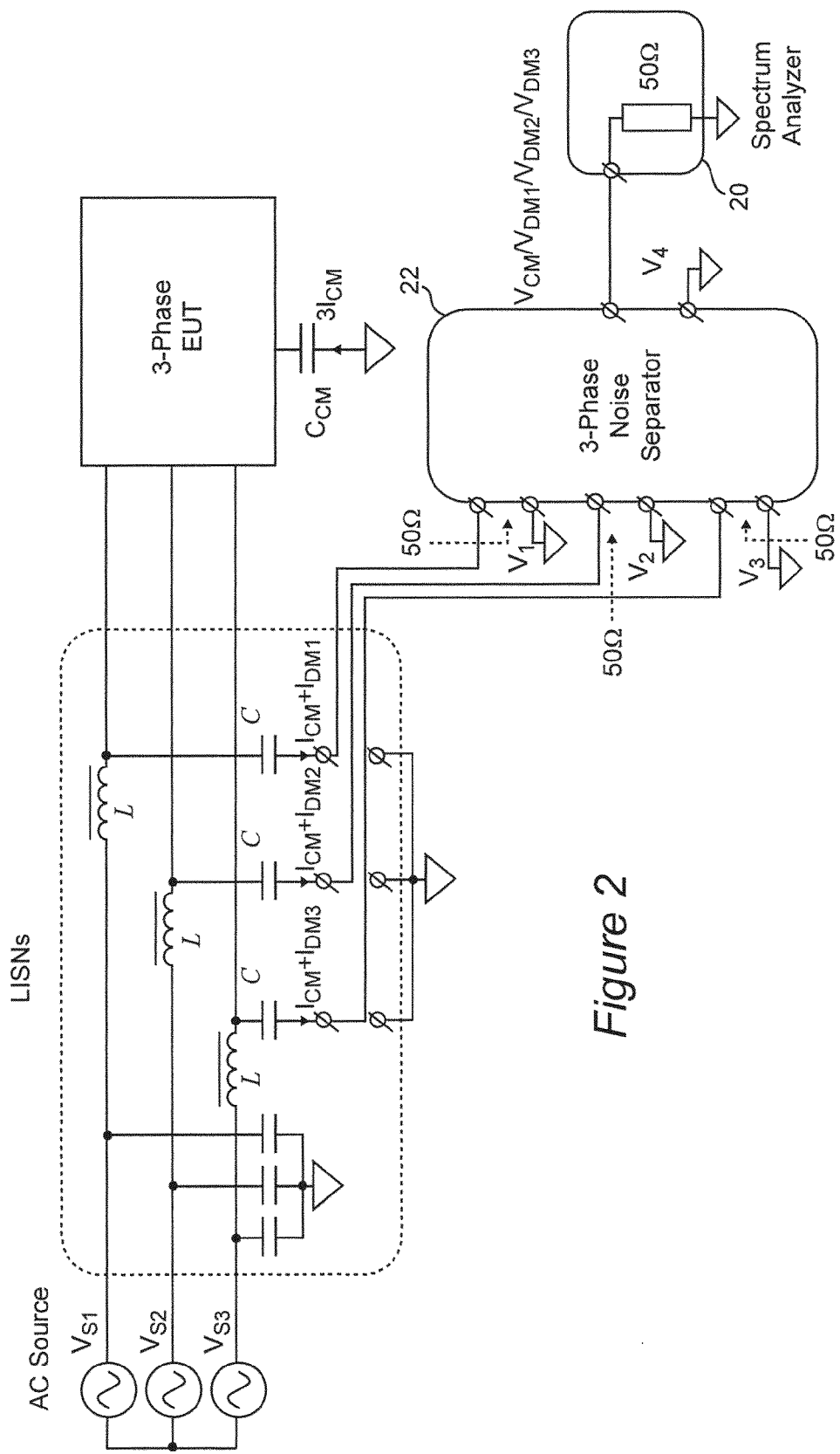
FIG. 2 is a schematic diagram of a similarly idealized set up for measurement of EMI noise and including a three-phase noise separator.

FIG. 2 shows much the same noise measurement set up as that shown in FIG. 1 but with the inclusion of an idealized three phase noise separator 22 (having 50Ω impedance inputs preferably constituted by LISNs)interposed between LISN output 18 and spectrum analyzer 20 which terminates the output of the separator 22 with a 50Ω input impedance. The three-phase noise separator 22 is depicted as having three inputs or, more generally, an input for each power phase, and a single output which can deliver $V_{CM}$, $V_{DM1}$, $V_{DM2}$ or $V_{DM3}$, as illustrated. It should be understood that such a multi-phase noise separator has not existed prior to the present invention. For example, an array of single phase noise separators, as alluded to above, cannot provide such a function since, among other shortcomings, they have only two phase inputs and cannot separate CM and DM noise for three phases.

In order to properly separate CM and DM noise and separate DM noise in the respective phases, the noise separator 22 should satisfy three requirements regardless of the number of power phases it accommodates:

1.) input impedances are always real 50Ω resistances and are independent from noise source impedances to guarantee consistent measurement conditions and accurate sampling of the noise voltage, 2.) the output of CM noise is $|(V_1+V_2+V_3)/3|$ and DM noise of the respective phases is $|(2V_1-V_2-V_3)/3|$ for $DM_1$ (phase 1), $|(2V_2-V_1-V_3)/3|$ for $DM_2$ (phase 2) and $|(2V_3-V_1-V_2)/3|$ for $DM_3$ (phase 3), in accordance with equations 1-4, to guarantee noise separation, and 3.) leakage between the CM and DM noise at the output should be small to guarantee small interference between CM and DM noise measurements.

Requirement 1.) can be characterized using network parameters, such as the reflection coefficient in wave theory. Requirement 2.) can be characterized by the transmission coefficient of the noise separators. The DM transmission ratio (DMTR) for the DM noise separator and the CM transmission ratio (CMTR) for the CM noise separator are two parameters which must be characterized and evaluated and can be defined, for two-line single phase systems which may be considered as two-phase noise separators (as discussed in "Characterization, Evaluation, and Design of Noise Separator for Conducted EMI Noise Diagnosis" by Wang et al., IEEE Transactions of Power Electronics, Vol. 20, No. 4, July, 2005, which is hereby fully incorporated by reference, a detailed design for which is disclosed in U.S. patent application Ser. No. 12/548,030, filed Aug. 26, 2009, and hereby fully incorporated by reference,) as:

$$CMTR = \left|\frac{V_{CM\_out}}{V_{CM\_in}}\right|, \quad (5)$$

for the CM noise separator, and $$DMTR = \left|\frac{V_{DM\_out}}{V_{DM\_in}}\right| \quad (6)$$

for the DM noise separator.

In equation (5), $V_{CM\_in}$ is the CM noise voltage excitation fed to the inputs of a CM noise separator; the CM noise voltage excitation added to each input port $V_{CM\_out}$ is the voltage response at the output of the CM noise separator due to $V_{CM\_in}$. In equation (6), $V_{DM\_in}$ is the DM voltage excitation fed to the inputs of a DM noise separator. $V_{DM\_out}$ is the voltage response at the output of the DM noise separator due to $V_{DM\_in}$. The ideal CMTR and DMTR determined from equations (5) and (6) should be 0 dB. However, as distinct from a two-phase DM noise separator, a three-phase DM noise separator has two DMTRs for each phase as will be discussed in greater detail below. More generally, for an n-phase noise separator, there is one CMTR and (n−1) DMTRs, which are from first to n−1 sequence. For the exemplary three-phase noise separator described below, the two sequences, DMTRs and DMRRs will be designated as positive (+) or negative (−) for increased clarity of notation.

The third requirement of a multi-phase CM and DM noise separator noted above can be characterized by two parameters: the DM rejection ratio (DMRR) and the CM rejection ratio (CMRR). For a two-phase noise separator DMRR and CMRR have been defined as:

$$DMRR = \left|\frac{V_{CM\_out}}{V_{DM\_in}}\right|, \quad (7)$$

for a CM noise separator, and $$CMRR = \left|\frac{V_{DM\_out}}{V_{CM\_in}}\right| \quad (8)$$

for a DM noise separator where $V_{DM\_in}$ is the DM voltage excitation fed to the inputs of a CM noise separator and $V_{CM\_out}$ is the voltage response at the output of the CM noise separator due to $V_{DM\_in}$. $V_{CM\_in}$ is the CM voltage excitation fed to the inputs of a DM noise separator and $V_{DM\_out}$ is the output voltage of the DM noise separator due to $V_{DM\_in}$. DMRR and CMRR should be as small as possible.

As distinct from a two-phase noise separator, a three-phase DM noise separator has a CMRR for each phase and a three-phase CM noise separator has two different DMRRs, as will be discussed more fully below. More generally, there is one CMRR and (n−1) DMRRs for an N-phase noise separator.

To characterize and evaluate noise separators in regard to the above three requirements, appropriate network parameters must be introduced. Particularly for purposes of this discussion and a multi-phase noise separator in accordance with the invention, scattering parameters (S-parameters) are particularly convenient since frequency domain characterization of a network employing Z, V, H and ABCD parameters often requires either a short circuit or an open circuit at one port (which is difficult to achieve at high frequencies involved in switched power converters due to parasitic parameters), S-parameters can be calibrated to the exact point of measurement (so that effects of parasitics due to measurement interconnects are excluded), and S-parameters are analytically convenient and allow use of a flow graph as a powerful tool with clear physical concepts for network analysis for development of a multi-phase noise separator.

Multi-phase noise separators can be evaluated using transmission and reflection ratios of CM and DM noise as discussed above. For the three-phase noise separator of FIG. 2, the three-phase noise set applied to the input ports has six degrees of freedom because the magnitude and phase of each phase are independent of the other phases. (For a multi-phase noise separator having n phases, the number of degrees of freedom would be 2n.) Accordingly, the parameters used to characterize a three-phase noise separator must also have six degrees of freedom. Based on symmetrical-component theory, an unbalanced three-phase voltage set can be decomposed into three voltage sets: a zero sequence voltage set ($V^0$, $V^0$, $V^0$, a positive sequence voltage set ($V_1^+$, $V_2^+$, $V_3^+$) and a negative sequence voltage set ($V_1^-$, $V_2^-$, $V_3^-$). Each set has two degrees of freedom (magnitude and phase) providing, in total, six degrees of freedom, sufficient to characterize a three-phase noise separator. (Unbalanced voltage sets having more than three phases can be decomposed into a number of voltage sets corresponding to the number of phases providing a correspondingly increased number of degrees of freedom sufficient to characterize the network. That is, an n-phase unbalanced voltage set can be decoupled to one zero sequence voltage set and (n−1) sequence voltage sets.) Applying the symmetrical-component theory to noise analysis yields:

$$\begin{pmatrix} V_1 \\ V_2 \\ V_3 \end{pmatrix} = \begin{pmatrix} V^0 \\ V^0 \\ V^0 \end{pmatrix} + \begin{pmatrix} V_1^+ \\ V_2^+ \\ V_3^+ \end{pmatrix} + \begin{pmatrix} V_1^- \\ V_2^- \\ V_3^- \end{pmatrix} \quad (9)$$

That is, the total noise voltage is equal to the sum of CM and DM noise. Accordingly, equation (1) for CM noise can be represented as:

$$V_{CM\_in} = \frac{V_1 + V_2 + V_3}{3} = V^0 \quad (10)$$

and equations (2)-(4) can be represented as:

$$\begin{pmatrix} V_{DM1\_in} \\ V_{DM2\_in} \\ V_{DM3\_in} \end{pmatrix} = \begin{pmatrix} V_1 \\ V_2 \\ V_3 \end{pmatrix} - \begin{pmatrix} V_{CM\_in} \\ V_{CM\_in} \\ V_{CM\_in} \end{pmatrix} = \begin{pmatrix} V_1^+ \\ V_2^+ \\ V_3^+ \end{pmatrix} + \begin{pmatrix} V_1^- \\ V_2^- \\ V_3^- \end{pmatrix} \quad (11)$$

Figure 3:
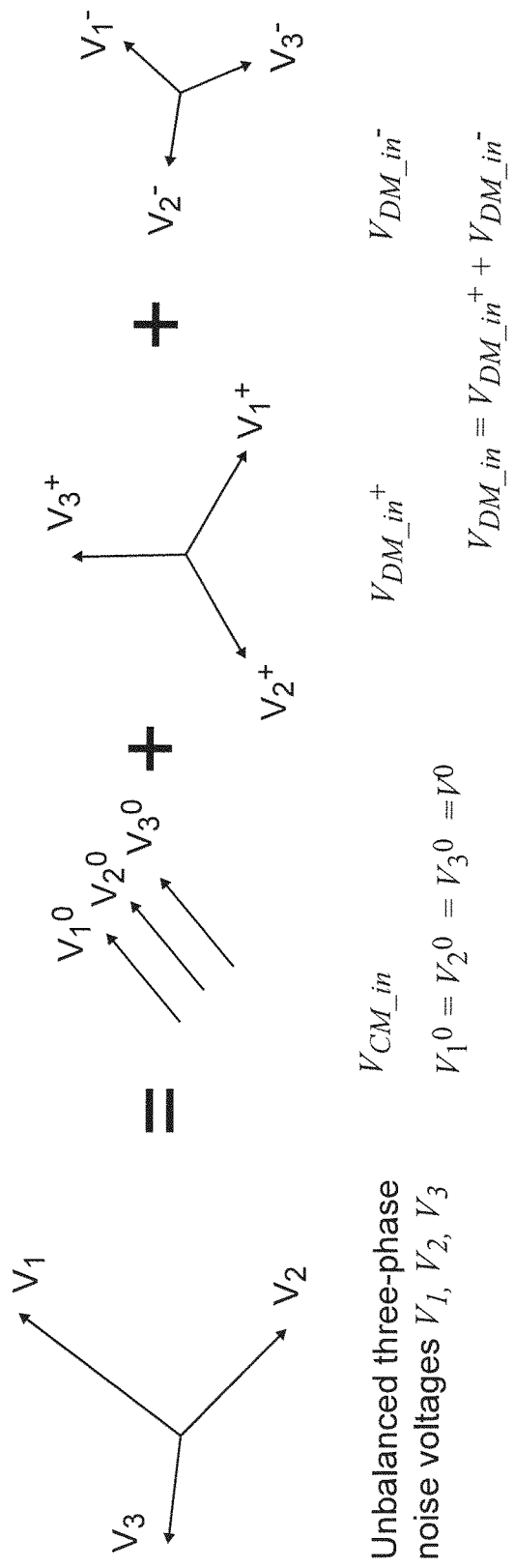
FIG. 3 illustrates theoretical decomposition of unbalanced three-phase EMI noise voltages into a CM component and positive and negative sequences of DM noise voltages.

Equation (10) indicates that the CM noise voltage is the same as the zero sequence noise voltage and equation (11) indicates that the DM noise of each phase is the sum of the positive and negative sequences of noise voltages. These relationships are graphically depicted in FIG. 3 where $V_{DM\_in}^+$ and $V_{DC\_in}^-$ are positive and negative sequence voltage sets, respectively. The corresponding CM output and/or DM outputs can thus be calculated from:

$$V_{CM\_out} = CMTR \times V_{CM\_in} \quad (12)$$

$$\begin{pmatrix} V_{DM1\_out} \\ V_{DM2\_out} \\ V_{DM3\_out} \end{pmatrix} = \begin{pmatrix} DMTR_1^+ \times V_1^+ \\ DMTR_2^+ \times V_2^+ \\ DMTR_3^+ \times V_3^+ \end{pmatrix} + \begin{pmatrix} DMTR_1^- \times V_1^- \\ DMTR_2^- \times V_2^- \\ DMTR_3^- \times V_3^- \end{pmatrix} \quad (13)$$

in which CMTR is the CM transmission ratio as discussed above and, since positive and negative sequence voltages are independent from each other, each phase has both a positive DM transmission ratio ($DMTR^+$) and a negative DM transmission ratio ($DMTR^-$).

Based on equation (12), the CMTR for a CM noise separator can be calculated as:

$$CMTR = \frac{V_{CM\_out}}{V_{CM\_in}}\bigg|_{V_{DM\_in}^+=0, V_{DM\_in}^-=0} \quad (14)$$

Similarly, based on equation (13), the DMTRs for a DM noise separator can be calculated as:

$$DMTR_n^+ = \frac{V_{DMn\_out}}{V_n^+}\bigg|_{V_{DM\_in}^-=0, V_{CM\_in}=0}, \quad (15)$$

in which n is the phase number (e.g. from 1 to 3). Equation (15) represents a positive sequence voltage being fed to a noise separator while the negative sequence voltage set and the CM noise are set to zero. Similarly, equation (16):

$$DMTR_n^- = \frac{V_{DMn\_out}}{V_n^-}\bigg|_{V_{DM\_in}^+=0, V_{CM\_in}=0} \quad (16)$$

represents a negative sequence voltage being fed to the noise separator while the positive sequence voltage set and the CM noise are set to zero. Because the outputs of a noise separator are the vector sum of positive and negative sequence voltage responses, both magnitude and phase of $DMTR^+$ and $DMTR^-$ are important. Ideally, both magnitudes should be 0 dB and the phases should be the same. In contrast, the phase of CMTR is not important since only its magnitude is measured by a spectrum analyzer. An ideal CMTR should also be 0 dB.

Similarly, a CM noise separator exhibits a positive DM rejection ratio ($DMRR^+$) and a negative DM rejection ratio ($DMRR^-$):

$$DMRR^+ = \frac{V_{CM\_out}}{V_1^+}\bigg|_{V_{DM\_in}^-=0, V_{CM\_in}=0} \quad (17)$$

$$DMRR^- = \frac{V_{CM\_out}}{V_1^-}\bigg|_{V_{DM\_in}^+=0, V_{CM\_in}=0} \quad (18)$$

Equation (17) represents a positive sequence voltage set being fed to the noise separator while the negative and zero sequence voltage sets are set to zero. Similarly, equation (18) represents a negative sequence voltage set being fed to the noise separator while the positive and zero sequence voltage sets are set to zero. Both DMRRs should be as small as possible. When they are much smaller than 0 dB, their phases are not important.

Similarly, each phase of a DM noise separator exhibits a CM rejection ration (CMRR) given by:

$$CMRR_n = \frac{V_{DMn\_out}}{V_{CM\_in}}\bigg|_{V_{DM\_in}^+=0, V_{DM\_in}^-=0} \quad (19)$$

In equation (19), n is the phase number (e.g. 1 to 3). The CMRR should be as small as possible and its phase is not important since, as noted above, only its magnitude is measured by a spectrum analyzer. It should be understood and appreciated that, since the DM noise has four degrees of freedom, any evaluation methods having fewer degrees of freedom cannot offer a full evaluation of DMTR and DMRR.

Figure 4:
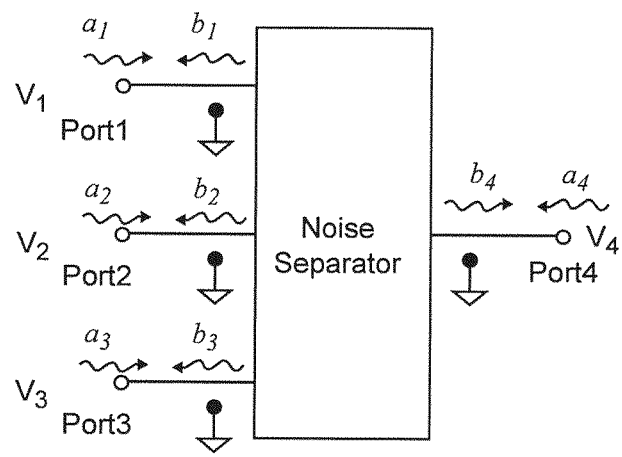
FIG. 4 illustrates a characterization of a three-phase noise separator in terms of waves.

To characterize the three-phase noise separator of FIG. 2 using S-parameters, in the CM or DM noise separator of FIG. 2, there are three input ports and one output port, making the noise separator a four-port network. This four-port, linear, passive network can be characterized in terms of waves as shown in FIG. 4 in which the input ports are labeled port 1-port 3 and the output port is labeled port 4. In FIG. 4, the normalized vector incident wave for the n-th port is labeled $a_n$ and the normalized reflected vector wave on the n-th port is labeled $b_n$. The voltage, $V_n$ on a given port is thus:

$$V_a = \sqrt{Z_0}(a_n + b_n) \quad (20)$$

where $Z_0$ is the reference impedance, which is preferably 50Ω and n is the port number.

To fully characterize a four-port, linear, passive network, four linear equations among eight wave variables are required. Sixteen S-parameters are thus introduced to correlate $a_n$ with $b_n$ as follows:

$$\begin{pmatrix} b_1 \\ b_2 \\ b_3 \\ b_4 \end{pmatrix} = \begin{pmatrix} S_{11} & S_{12} & S_{13} & S_{14} \\ S_{21} & S_{22} & S_{23} & S_{24} \\ S_{31} & S_{32} & S_{33} & S_{34} \\ S_{41} & S_{42} & S_{43} & S_{44} \end{pmatrix} \begin{pmatrix} a_1 \\ a_2 \\ a_3 \\ a_4 \end{pmatrix} \Rightarrow [b] = [S][a] \quad (21)$$

$S_{nn}$, represents reflection coefficients and $S_{mn}$ represents transmission coefficients. Both n and m are port numbers. (The subscripts are used to distinguish port number. For a linear, passive network, the matrix is symmetric to the diagonal, so some parameters are the same. However, this fact does not invalidate the matrix itself and the matrix and subscripts are necessary to represent the general case.)

According to transmission line theory, when reflected wave $b_n$ reaches the source or load side, it will also be reflected because of mismatched impedances. The reflection coefficients $\Gamma_{sn}$, at the source side and $\Gamma_L$ at the load side are given by:

$$\Gamma_{Sn} = \frac{Z_{Sn} - Z_0}{Z_{Sn} + Z_0}, \text{ and} \quad (22)$$

$$\Gamma_L = \frac{Z_L - Z_0}{Z_L + Z_0}. \quad (23)$$

It is known that for passive networks $|\Gamma_{sn}| \leq 1$ and $|\Gamma_L| \leq 1$.

Figure 5:
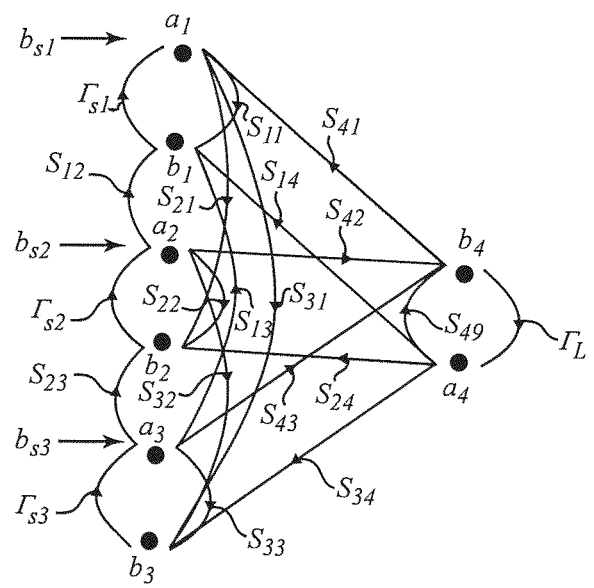
FIG. 5 is a diagram characterizing a noise separator using a signal-flow graph.

The noise separator of FIG. 4 can then be characterized by the flow graph of FIG. 5 in which $b_{sn}$ is the normalized wave emanating from the source. For a given voltage source $V_{sn}$ with source impedance $Z_{sn}$, $b_{sn}$ is given by $$b_{Sn} = \frac{\sqrt{Z_0} V_{Sn}}{Z_{Sn} + Z_0} \quad (24)$$

Because the output of the noise separator is terminated by the 50Ω output impedance of the spectrum analyzer (shown in FIG. 2), the reflection coefficient, $\Gamma_L$ is zero. As a result, $a_4$ is zero and the signal flow graph of FIG. 5 reduces to that shown in FIG. 6 which characterizes a practical noise separator matched by a spectrum analyzer at port 4.

Figure 6:
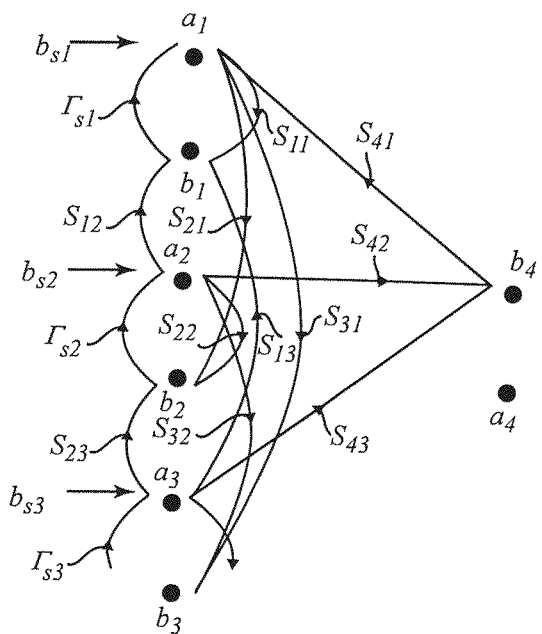
FIG. 6 illustrates a somewhat simplified signal flow graph for a practical noise separator having a matched load at port 4.
Figure 7:
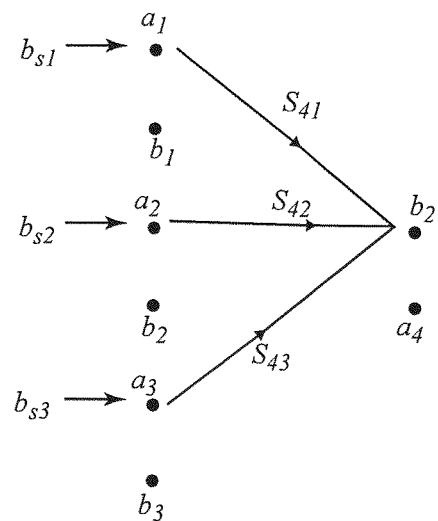
FIG. 7 illustrates a signal-flow graph for an ideal three-phase noise separator with a matched load at port 4.

The determination of the appropriate S-parameter matrix for an ideal noise separator will now be discussed. In order to achieve 50Ω input impedance that is independent from noise source impedance, the reflection coefficients at port 1, port 2 and port 3 must be zero. In FIG. 6, by using Mason's Rule, the reflection coefficients $\Gamma_1$, $\Gamma_2$ and $\Gamma_3$ for the respective ports are given by $$\Gamma_1 = \frac{Z_{in1} - Z_0}{Z_{in1} + Z_0} \quad (25)$$

$$= S_{11} + \frac{\begin{array}{c} S_{21}\Gamma_{s2}S_{12}(1 - S_{33}\Gamma_{s3}) + \\ S_{31}\Gamma_{s3}S_{13}(1 - S_{22}\Gamma_{s2}) + \\ S_{31}\Gamma_{s3}S_{23}\Gamma_{s2}S_{12} \end{array}}{1 - S_{22}\Gamma_{s2} - S_{33}\Gamma_{s3} - S_{32}\Gamma_{s3}S_{23}\Gamma_{s2} + S_{22}\Gamma_{s2}S_{33}\Gamma_{s3}}$$

$$= S_{11} + \Delta_1,$$

$$\Gamma_2 = \frac{Z_{in2} - Z_0}{Z_{in2} + Z_0} \quad (26)$$

$$= S_{22} + \frac{\begin{array}{c} S_{12}\Gamma_{s1}S_{21}(1 - S_{33}\Gamma_{s3}) + \\ S_{32}\Gamma_{s3}S_{23}(1 - S_{11}\Gamma_{s1}) + \\ S_{32}\Gamma_{s3}S_{13}\Gamma_{s1}S_{21} \end{array}}{1 - S_{11}\Gamma_{s1} - S_{33}\Gamma_{s3} - S_{31}\Gamma_{s3}S_{13}\Gamma_{s1} + S_{11}\Gamma_{s1}S_{33}\Gamma_{s3}}$$

$$= S_{22} + \Delta_2,$$

and $$\Gamma_3 = \frac{Z_{in3} - Z_0}{Z_{in3} + Z_0} \quad (27)$$

$$= S_{33} + \frac{\begin{array}{c} S_{23}\Gamma_{s2}S_{32}(1 - S_{11}\Gamma_{s1}) + \\ S_{13}\Gamma_{s1}S_{31}(1 - S_{22}\Gamma_{s2}) + \\ S_{13}\Gamma_{s1}S_{21}\Gamma_{s2}S_{32} \end{array}}{1 - S_{11}\Gamma_{s1} - S_{22}\Gamma_{s2} - S_{12}\Gamma_{s1}S_{21}\Gamma_{s2} + S_{11}\Gamma_{s1}S_{22}\Gamma_{s2}}$$

$$= S_{33} + \Delta_3$$

where $Z_{in1}$, $Z_{in2}$ and $Z_{in3}$ are the input impedances of port 1, port 2 and port 3, respectively and $\Delta_1$, $\Delta_2$ and $\Delta_3$ represent the second terms in equations 25-27, respectively. In order to guarantee a 50Ω impedance independent from noise source impedance in accordance with equations 25-27, $S_{11}$, $S_{22}$, $S_{33}$ and $S_{12}$, $S_{21}$, $S_{13}$, $S_{31}$, $S_{32}$, $S_{23}$ must be zero such that $b_1$, $b_2$ and $b_3$ become zero. Under such ideal conditions, the flow graph of FIG. 6 further reduces to that illustrated in FIG. 7. Thus in FIG. 7, the voltage at port 4 can be determined from equation (20) as:

$$V_4 = V_1 S_{41} + V_2 S_{42} + V_3 S_{43} \quad (28)$$

Based on equations 1-4 and 28, for a CM separator:

$$S_{41} = S_{42} = S_{43} = \frac{1}{3}, \text{ or } S_{41} = S_{42} = S_{43} = -\frac{1}{3} \quad (29)$$

For the DM separator for phase 1:

$$S_{41} = \frac{2}{3}, S_{42} = -\frac{1}{3}, S_{43} = -\frac{1}{3}, \text{ or } S_{41} = -\frac{2}{3}, S_{42} = \frac{1}{3}, S_{43}\frac{1}{3} \quad (30)$$

For the DM separator for phase 2:

$$S_{41} = -\frac{1}{3}, S_{42} = \frac{2}{3}, S_{43} = -\frac{1}{3}, \text{ or } S_{41} = \frac{1}{3}, S_{42} = -\frac{2}{3}, S_{43}\frac{1}{3} \quad (31)$$

For the DM separator for phase 3:

$$S_{41} = -\frac{1}{3}, S_{42} = -\frac{1}{3}, S_{43} = \frac{2}{3}, \text{ or } S_{41} = \frac{1}{3}, S_{42} = \frac{1}{3}, S_{43} - \frac{2}{3} \quad (32)$$

Thus, the final S-parameter matrix for an ideal CM noise separator is $$[S] = \begin{pmatrix} 0 & 0 & 0 & S_{14} \\ 0 & 0 & 0 & S_{24} \\ 0 & 0 & 0 & S_{34} \\ \pm\frac{1}{3} & \pm\frac{1}{3} & \pm\frac{1}{3} & S_{44} \end{pmatrix} \quad (33)$$

The S-parameter matrix for the ideal DM separator for phase 1 is $$[S] = \begin{pmatrix} 0 & 0 & 0 & S_{14} \\ 0 & 0 & 0 & S_{24} \\ 0 & 0 & 0 & S_{34} \\ \pm\frac{2}{3} & \mp\frac{1}{3} & \mp\frac{1}{3} & S_{44} \end{pmatrix} \quad (34)$$

The S-parameter matrix for the ideal DM separator for phase 2 is $$[S] = \begin{pmatrix} 0 & 0 & 0 & S_{14} \\ 0 & 0 & 0 & S_{24} \\ 0 & 0 & 0 & S_{34} \\ \mp\frac{1}{3} & \pm\frac{2}{3} & \mp\frac{1}{3} & S_{44} \end{pmatrix} \quad (35)$$

The S-parameter matrix for the ideal DM separator for phase 3 is $$[S] = \begin{pmatrix} 0 & 0 & 0 & S_{14} \\ 0 & 0 & 0 & S_{24} \\ 0 & 0 & 0 & S_{34} \\ \mp\frac{1}{3} & \mp\frac{1}{3} & \pm\frac{2}{3} & S_{44} \end{pmatrix} \quad (36)$$

In equations 33-36, the fourth column in the S-parameter matrix has nothing to do with the performance of the noise separator because port 4 is matched as discussed above. Therefore, there is no output impedance requirement. For a noise separator, $S_{11}$, $S_{22}$, $S_{33}$ and $S_{12}$, $S_{21}$, $S_{13}$, $S_{31}$, $S_{32}$, $S_{23}$ should be as small as possible, $S_{41}$, $S_{42}$ and $S_{44}$ should be $\pm\frac{1}{3}$ for a CM noise separator. For a DM noise separator, $S_{41}$, $S_{42}$ and $S_{44}$ should be $\pm\frac{2}{3}$, $\mp\frac{1}{3}$ and $\mp\frac{1}{3}$ for phase 1, $\mp\frac{1}{3}$, $\pm\frac{2}{3}$ and $\mp\frac{1}{3}$ for phase 2 and $\mp\frac{1}{3}$, $\mp\frac{1}{3}$ and $\pm\frac{2}{3}$ for phase 3.

However, for a practical, as distinct from an ideal, noise separator, $S_{11}$, $S_{22}$, $S_{33}$ and $S_{12}$, $S_{21}$, $S_{13}$, $S_{31}$, $S_{32}$, $S_{23}$ are not zero and $S_{41}$, $S_{42}$ and $S_{44}$ will not be exactly equal to the values defined in equations 34-36. Therefore, the signal-flow graph of FIG. 6 should be used for evaluation. The input impedance of a noise separator can be evaluated using equations 25-27. In those equations, the second term (also represented by $\Delta_n$ where n is the port number) can be ignored if it is much smaller than the first term. This means that, in such a case, the input impedances are independent of $\Gamma_{s1}$, $\Gamma_{s2}$ and $\Gamma_{s3}$ which represent the source impedances. Thus the input impedances can be characterized solely by $S_{11}$, $S_{22}$ and $S_{33}$ and are free of noise source impedances in accordance with $$Z_{in1} \approx Z_0 \frac{1+S_{11}}{1-S_{11}}, \quad (37)$$

$$Z_{in2} \approx Z_0 \frac{1+S_{22}}{1-S_{22}}, \text{ and} \quad (38)$$

$$Z_{in3} \approx Z_0 \frac{1+S_{33}}{1-S_{33}}. \quad (39)$$

Based on equation 14 and equation 20, and FIG. 6, the CMTR for the CM noise separator can be derived using Mason's Rule as follows:

$$CMTR = \frac{S_{41}}{(1+S_{11}+\Delta_1)} + \frac{S_{42}}{(1+S_{22}+\Delta_2)} + \frac{S_{43}}{(1+S_{33}+\Delta_3)} \quad (40)$$

$$\approx \frac{S_{41}}{(1+S_{11})} + \frac{S_{42}}{(1+S_{22})} + \frac{S_{43}}{(1+S_{33})}$$

where the approximately equal values hold if the third term in the denominators (e.g. $\Delta_n$) is much smaller than the second term in the denominators (which is also the condition for independent real 50Ω impedances noted above for equations 37-39). As also noted above, for a good CM separator, the magnitude of the CMTR should be close to 0 dB.

Based on equations 15, 16 and 20 and FIG. 6, the DMTR$^+$ and DMTR$^-$ for a DM noise separator can also be derived using Mason's Rule as follows $$DMTR^+ = \quad (41)$$
$$\frac{S_{41}}{(1+S_{11}+\Delta_1)} + \frac{S_{42}}{(1+S_{22}+\Delta_2)} \cdot e^{-j120°} + \frac{S_{43}}{(1+S_{33}+\Delta_3)} \cdot e^{-j240°}$$

$$DMTR^- = \quad (42)$$
$$\frac{S_{41}}{(1+S_{11}+\Delta_1)} + \frac{S_{42}}{(1+S_{22}+\Delta_2)} \cdot e^{j120°} + \frac{S_{43}}{(1+S_{33}+\Delta_3)} \cdot e^{j240°}$$

for the DM separator for phase 1, $$DMTR^+ = \quad (43)$$
$$\frac{S_{41}}{(1+S_{11}+\Delta_1)} \cdot e^{j120°} + \frac{S_{42}}{(1+S_{22}+\Delta_2)} + \frac{S_{43}}{(1+S_{33}+\Delta_3)} \cdot e^{-j120°}$$

$$DMTR^- = \quad (44)$$
$$\frac{S_{41}}{(1+S_{11}+\Delta_1)} \cdot e^{-j120°} + \frac{S_{42}}{(1+S_{22}+\Delta_2)} + \frac{S_{43}}{(1+S_{33}+\Delta_3)} \cdot e^{j120°}$$

for the DM separator for phase 2, and $$DMTR^+ = \quad (45)$$
$$\frac{S_{41}}{(1+S_{11}+\Delta_1)} \cdot e^{j240°} + \frac{S_{42}}{(1+S_{22}+\Delta_2)} \cdot e^{j120°} + \frac{S_{43}}{(1+S_{33}+\Delta_3)}$$

$$DMTR^- = \quad (46)$$
$$\frac{S_{41}}{(1+S_{11}+\Delta_1)} \cdot e^{-j240°} + \frac{S_{42}}{(1+S_{22}+\Delta_2)} \cdot e^{-j120°} + \frac{S_{43}}{(1+S_{33}+\Delta_3)}$$

for the DM separator for phase 3.

As analyzed above, for $DMTR_n^+$ and $DMTR_n^-$, both magnitude and phase are important because the output of the DM noise separator is the vector sum of the positive and negative sequence voltage vectors. For a good DM noise separator, the magnitude of both $DMTR_n^+$ and $DMTR_n^-$ should be close to 0 dB and their phases should be approximately the same so that the vector sum of the two sequences would not be significantly changed at each frequency appearing in the noise. That is, as long as their phases are almost the same, the sum of the amplitudes at the output at each frequency would be substantially the same as the input. Their phases need not be zero degrees since only the amplitude at each frequency is of interest and the time domain waveform at the outputs is unimportant.

Based on equations 17-19, FIG. 6 and the symmetrical component theory, the $DMRR^+$ and $DMRR^-$ for the CM noise separator and the CMRR for the DM noise separator can be similarly derived as follows:

$$DMRR^+ = \frac{S_{41}}{(1+S_{11}+\Delta_1)} + \frac{S_{42}}{(1+S_{22}+\Delta_2)} \cdot e^{-j120°} + \frac{S_{43}}{(1+S_{33}+\Delta_3)} \cdot e^{-j240°} \quad (47)$$

$$DMRR^- = \frac{S_{41}}{(1+S_{11}+\Delta_1)} + \frac{S_{42}}{(1+S_{22}+\Delta_2)} \cdot e^{j120°} + \frac{S_{43}}{(1+S_{33}+\Delta_3)} \cdot e^{j240°} \quad (48)$$

for the CM separator, and $$CMRR_n = \frac{S_{41}}{(1+S_{11}+\Delta_1)} + \frac{S_{42}}{(1+S_{22}+\Delta_2)} + \frac{S_{43}}{(1+S_{33}+\Delta_3)} \quad (49)$$

for the DM separator.

Equations 25-27 and 40-49 are of particular importance for multi-phase noise separator evaluation. As long as the S-parameters are measured using a network analyzer, its performance can be evaluated using these equations. If the second terms (e.g. $\Delta_n$) are much smaller than the first terms, the input impedances are independent of the noise source impedances.

Based on the above analysis showing that the CM noise is the zero sequence noise and the DM noise is the sum of the positive and negative sequence noise, a three-phase or multi-phase noise separator can be designed by developing two networks, one that passes zero sequence noise while blocking positive and negative sequence noise and the other that passes positive and negative sequence noise while blocking zero sequence noise. These two networks can then be connected in parallel to form a combined network.

Based on network theory the combined network can achieved both of these noise separation functions while providing a 50Ω input impedance for any noise signal. This concept is shown in FIG. 8.

Figure 8:
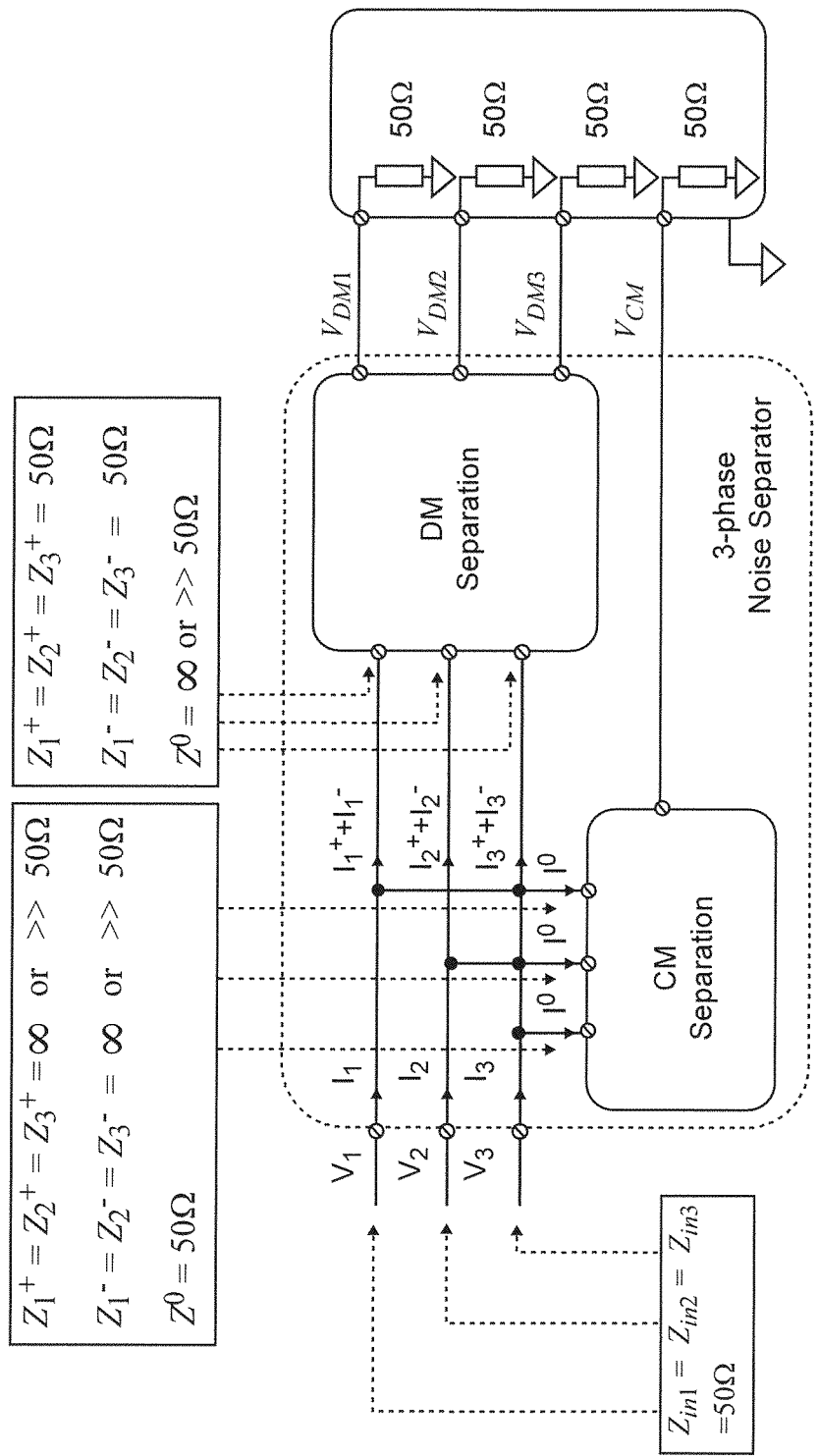
FIG. 8 is a schematic diagram of the architecture of a three-phase noise separator in accordance with the invention.

More specifically, FIG. 8 shows a DM separation unit which ideally exhibits a 50Ω input impedances $Z_1^+$, $Z_2^+$ and $Z_3^+$ for positive sequence noise and $Z_1^-$, $Z_2^-$ and $Z_3^-$ for negative sequence noise. Further, the DM separation unit ideally can conduct positive and negative sequence noise to a 50Ω load without attenuation while having a very high impedance, $Z^0$, for zero sequence noise and thus does not conduct zero sequence noise to the 50Ω load. Therefore, the DM separation unit DM noise from the total noise for each phase. Conversely, the CM separation unit ideally exhibits a 50Ω input impedance, $Z^0$, for zero sequence noise and thus can conduct zero sequence noise to a 50Ω load without attenuation while ideally exhibiting a high input impedance, $Z_1^+$, $Z_2^+$, $Z_3^+$ and $Z_1^-$, $Z_2^-$, $Z_3^-$ for each phase of positive and negative sequence noise. The CM separation unit can thus separate the CM noise from the total noise. Because the DM separation unit exhibits a 50Ω input impedance for positive and negative sequence noise and an infinite input impedance for zero sequence noise while the CM separation unit exhibits a 50Ω input impedance for zero sequence noise and an infinite input impedance for positive and negative sequence noise, the combined network having a parallel connection of the DM separation unit and the CM separation unit exhibits a 50Ω input impedance to the total noise; expressed analytically as:

$$Z_{inn} = \frac{V_n}{I_n} \quad (50)$$

$$= \frac{V^0 + V_n^+ + V_n^-}{I^0 + I_n^+ + I_n^-}$$

$$= \frac{V^0 + V_n^+ + V_n^-}{\frac{V^0}{50\Omega} + \frac{V_n^+}{50\Omega} + \frac{V_n^-}{50\Omega}}$$

$$= 50\Omega$$

Figure 29:
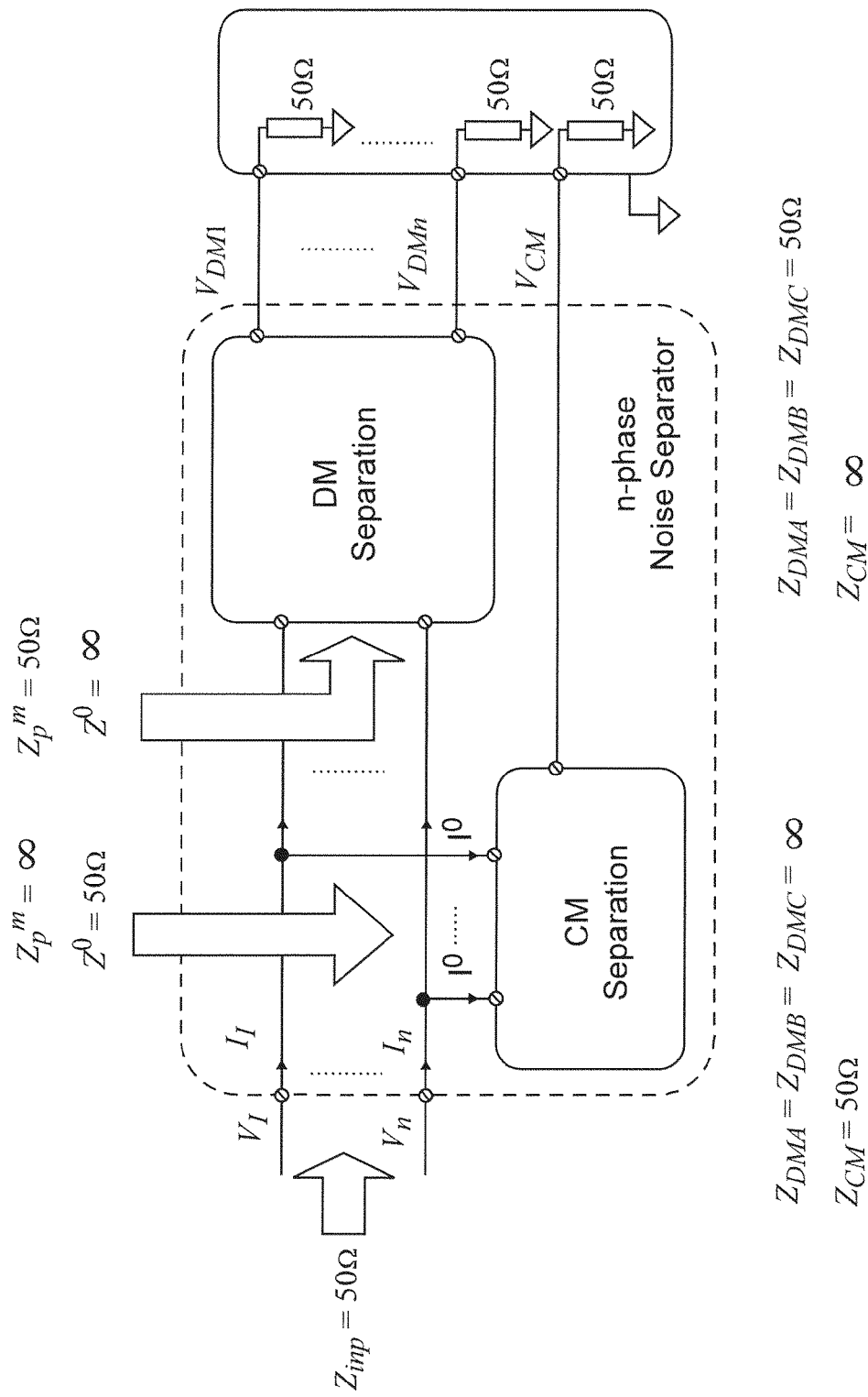
FIGS. 29, 30 and 31 are schematic depictions similar to FIGS. 8, 14 and portions of FIGS. 16 and 17 generalized to n-phases.
Figure 30:
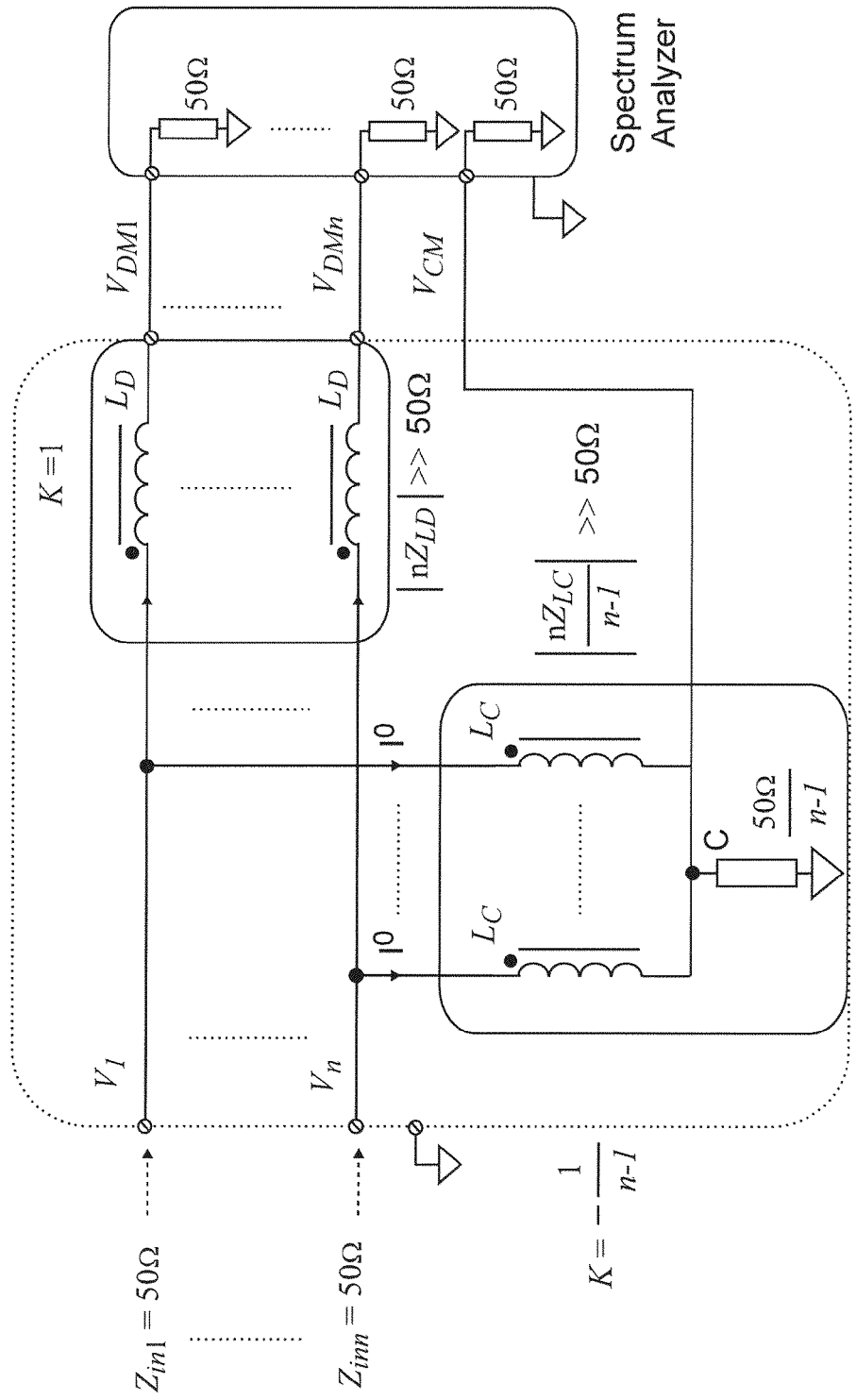
Figure 31:
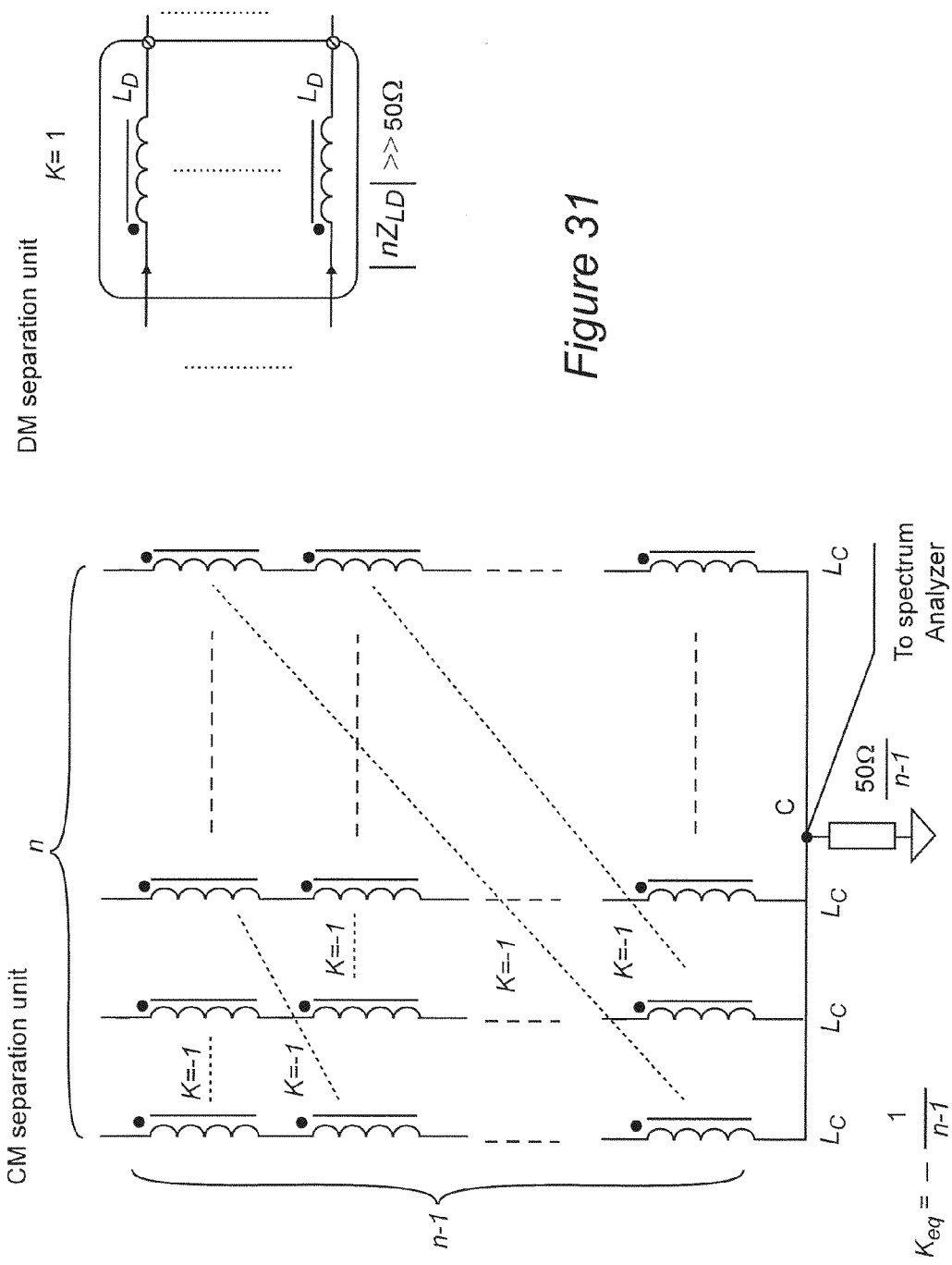

Referring again to FIG. 3, it will be observed from the decomposition of multi-phase noise into CM and DM components that the CM noise components are of a single, common phase while both the positive and negative DM noise components are of separated phases. Each of the positive and negative sequence noise components also has a vector sum of zero. The inventors have recognized that this distinction between the CM noise components and the DM noise components can be used to separate these noise components for any number of phases with high selectivity using appropriately designed and differently would sets of coupled inductors for the DM and CM separation units. Generalizations of FIGS. 8, 14 and portions of FIGS. 16 and 17 for an n-phase embodiment of the invention are provided in FIGS. 29-31, respectively.

The DM Separation Unit

Figure 9A:
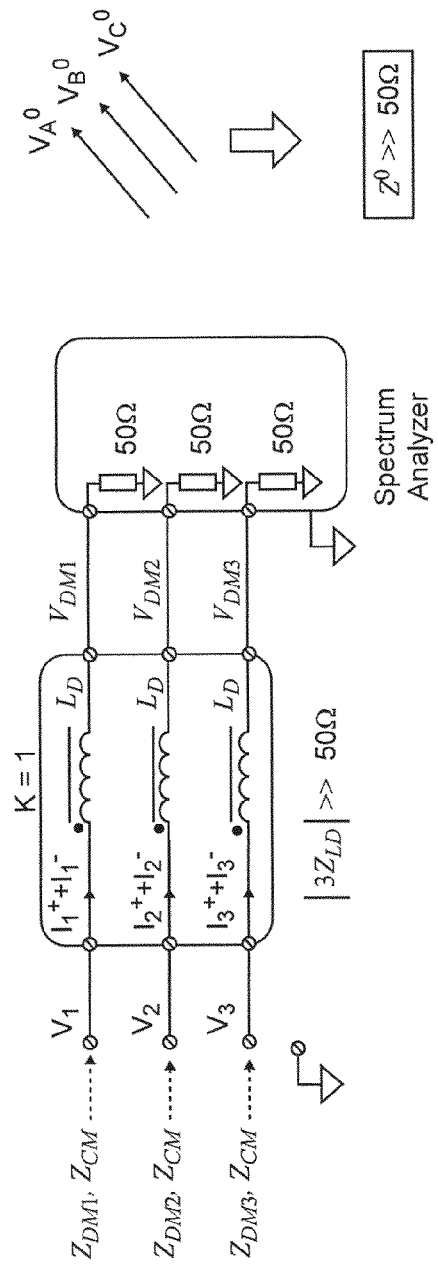
FIG. 9A is a schematic circuit diagram for the DM separation unit of the noise separator in FIG. 8.
Figure 10:
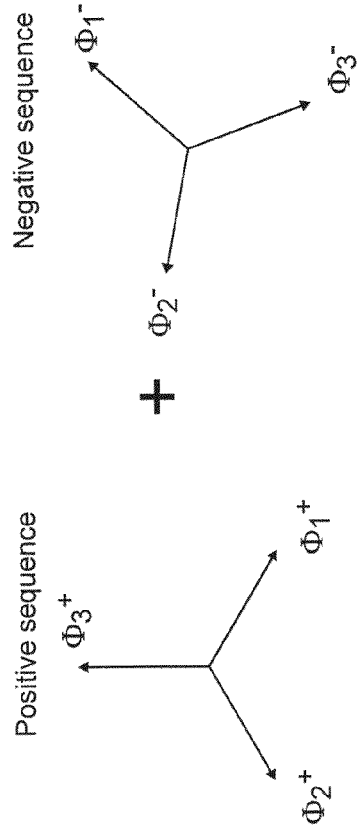
FIG. 10 illustrates cancellation of magnetic flux of positive and negative sequence noise.

For the DM separation unit, an inductor is connected in series in each phase which are coupled by being wound on a single magnetic core with a coupling coefficient, K, closely approximating and preferably equal to 1. Thus, for a three-phase DM separator, three coupled inductors (sometimes referred to hereinafter in the singular as a three-phase or multi-phase inductor) each having an inductance $L_D$ are connected in parallel in respective phases and are substantially balanced as schematically illustrated in FIG. 9A. A suitable structure for the three coupled inductors is illustrated in FIG. 9B (although the preferred number of turns of the windings has been reduced for clarity). These balanced impedances thus present an input impedance of $3Z_{LD}$ to CM (zero sequence) noise components within the frequency range of interest. Since the vector sum of each of the positive and negative sequence noise components has a vector sum of zero and the coupled inductors have a balanced structure, the magnetic flux generated by each phase cancels the flux generated by other phases inside the core as illustrated in FIG. 10. That is, $$\sum_{n=1}^{3} \Phi_n^+ + \sum_{n=1}^{3} \Phi_n^- = L_D \left( \sum_{n=1}^{3} I_n^+ + \sum_{n=1}^{3} I_n^- \right) = 0 \quad (51)$$

Thus, ideally, for positive and negative sequence noise components, the inductance and impedance are zero and the input impedance of each phase is equal to the load impedance (e.g. the 50Ω input impedance of a termination or a spectrum analyzer input). As a result, the DM noise constituted by the positive and negative sequence noise components is conducted to the load or spectrum analyzer without attenuation. In the DM noise separator of FIG. 9A, the input impedance for the CM noise component is thus given by $$Z_{CM} = 3Z_{LD} + 50 \quad (52)$$

$$Z_{CM} = 3Z_{LD} + 50 \quad (52)$$

and the CMRR is given by $$CMRR = 20\log\left|\frac{50}{3Z_{LD} + 50}\right| \quad (53)$$

It can be seen from equations 52 and 53 that the impedance of the coupled inductor for CM noise, $|3Z_{LD}|$, should be much larger than 50Ω to achieve good CMRR and high CM input impedance.

It should be further noted in regard to the DM separation unit, constituted as shown in FIG. 9A, that, if the coupling coefficient of the inductor is smaller than 1, there is leakage inductance of each phase. At high frequencies, the impedance of the leakage inductance could be significant and the input impedance will deviate from 50Ω; causing attenuation of the DM noise. Therefore, the coupling coefficient of the coupled inductors should be as close to unity as possible.

A suitable structure for the coupled inductor of the DM separation unit must have an inductance, $L_D$, large enough so that $|3Z_{LD}|$ A has an impedance much higher than 50Ω at frequencies of interest so that a good CMRR can be achieved and the leakage inductance should be small enough that the inductor exhibits a DM impedance much smaller than 50Ω (or other load impedance) so that DM noise attenuation is held to a low level and a good DMTR can be achieved. A three-phase inductor having these characteristics has been constructed using a high permeability, commercially available ferrite core (e.g. ZJ 422006TC (J material from Magnetics, Inc. 110 Delta Drive, Pittsburgh, Pa. 15238-0428. A trifilar (or, more generally, n-filar, having a number of conductors equal to the number of phases) winding structure is preferably employed to limit leakage and a thirty turn winding is employed to achieve a high coupling coefficient. A trifilar winding structure has three wires at almost the same position (e.g. separated by insulation encapsulating all three wires to achieve a desired relatively small spacing between the wires) so that leakage energy is stored only in the gap/airgap between the wires to achieve a low leakage inductance. The measured inductance of the inductance of the inductor is graphically illustrated in FIG. 15. The measured coupling coefficient between any two windings of the multi-phase inductor described above is 0.99995 and the leakage inductance for positive and negative sequence noise components is 174 nH.

Figure 15:
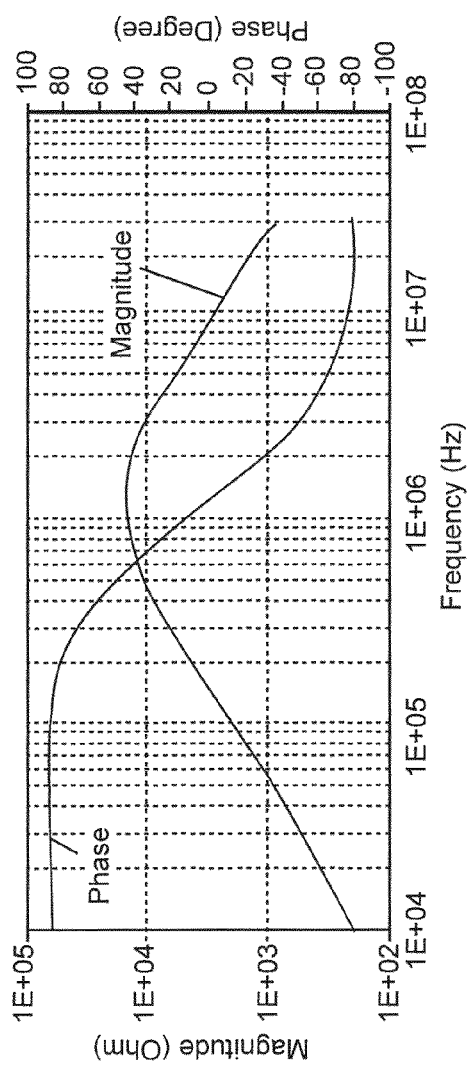
FIG. 15 is a graph of measured impedance $Z_{LD}$ for one DM separation inductor or three coupled DM separation inductors.

The measured impedance curves of FIG. 15 shows that the CM inductance is 2 mH with an equivalent CM parallel winding capacitance of 5.67 pF and an equivalent CM parallel resistance of 14.5 kΩ. At frequencies above 1.2 MHz, CM impedance is determined by the winding capacitance. The CM impedance $|3Z_{LD}|$ is much larger than 50Ω over most of the frequency range illustrated in FIG. 15 although it may be considered marginal at very low frequencies near 10 KHz. To further improve CMRR at low frequencies a larger inductance may be obtained by increasing the number of turns of the winding. However, doing so may compromise the high frequency impedance of the multi-phase inductor by increasing winding capacitance. Therefore, to obtain a good CMRR over an extreme range of frequencies, a good solution is to design a DM noise separator and its multi-phase inductor (having a comparatively larger inductance) for a low frequency range (e.g. 10 KHz to 150 KHz) that can be electrically interchanged with a DM noise separator and its multi-phase inductor (having a relatively smaller inductance) designed for a high frequency range (e.g. 150 KHZ to 30 MHZ). More than one such electrically interchangeable DM noise separator having different inductors and covering different frequency bands may be provided and such electrically interchangeable DM separator(s) are illustrated by dots in FIG. 14. The thirty turn multi-phase inductor described above corresponds to the latter, higher frequency range.

At 30 MHZ, the multi-phase inductor described above has a non-negligible (compared to a 50Ω load) impedance of 33Ω for DM noise. To reduce the effects of leakage inductance, the parasitic capacitance, $Z_0$, between the windings can be used to cancel the effects of leakage inductance based on transmission line transformer theory. To achieve this, for positive and negative sequence noise, the characteristic impedance of the three conductor (or multi-conductor) transmission line should be set close to 50Ω. Such a characteristic impedance can be designed by adjusting the space between the wires of the n-filar (e.g. trifilar) structure as illustrated in FIG. 9C. Increasing the spacing between wires increases $Z_0$ by decreasing capacitance between wires while decreasing the spacing between wires decreases $Z_0$ by increasing capacitance between wires. The measured characteristic impedance of the trifilar structure used in the above-described three-phase inductor is 43.3Ω which is sufficiently close to 50Ω that the effect of leakage is reduced.

The CM Separation Unit

Figures 11, 12:
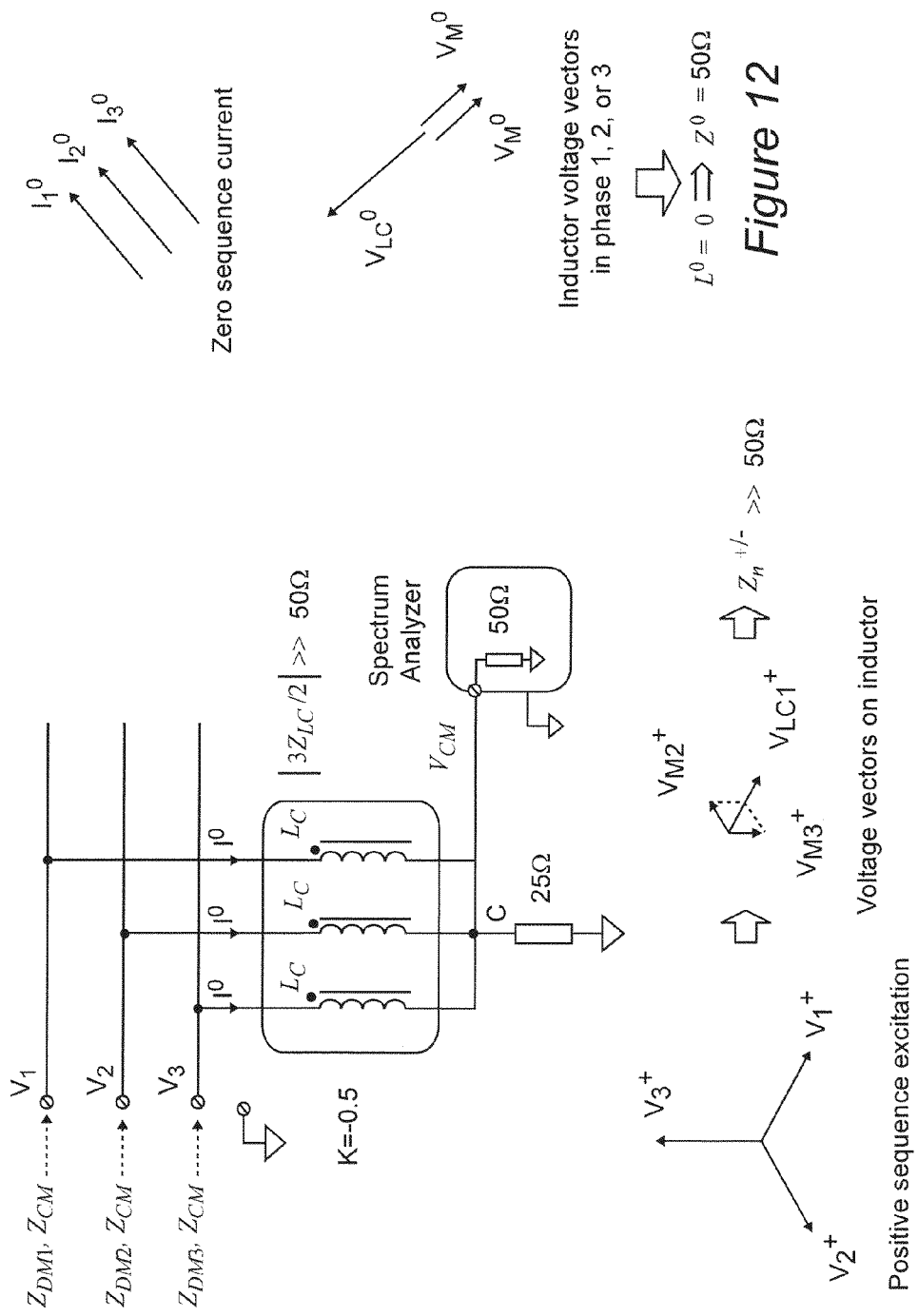
FIG. 11 is a schematic diagram of the CM separation unit of the noise separator of FIG. 8.
FIG. 12 illustrates the voltage drop across the inductors of FIG. 11 for zero sequence noise.

A circuit suitable for providing CM (zero sequence) noise separation in accordance with the invention is schematically illustrated in FIG. 11. While not particularly evident from the schematic diagram of FIG. 11, the three inductors illustrated, as will be discussed in detail below, are wound and coupled very differently from the coupled inductors of the multi-phase inductor for the DM separator described above. The inductors are also connected to a common node/center point, C, having a 25Ω impedance to ground and connected to a 50Ω termination or spectrum analyzer input. Each Inductor has an inductance of $L_C$ and a coupling coefficient between any two inductors is −0.5. Because this circuit has a balanced structure, the zero sequence voltage excitation (illustrated in FIG. 3) will generate zero sequence currents only. For CM (zero sequence) noise, the voltage vector sum, $V_{CM\_LC}$ of the induced voltage due to self-inductance $L_C$ and the induced voltage due to the mutual inductance, M, is zero, as illustrated in FIG. 12. That is, $$V_{CM\_LD} = V_{LC}^0 - V_M^0 - V_M^0 \quad (54)$$
$$= \left(j\omega L_D - j\omega \frac{L_D}{2} - j\omega \frac{L_D}{2}\right) \times I^0$$
$$= 0$$

For the inductor connected, for example, to phase 1 in FIG. 11, the voltage responses to positive and negative sequence noise are shown in FIGS. 13A and 13B. In FIG. 13A, the vector sum of the induced voltages $V_{M2}^+$ and $V_{M3}^+$ due to the mutual inductances has the same direction as that of induced voltage $V_{LC1}^+$ due to self-inductance and its amplitude is equal to 50% of $V_{LC1}^+$. The amplitude of the vector sum of the three vectors is therefore 150% of $V_{LC1}^+$ and equal to $V_1^+$. As a result, the positive sequence noise current in the inductor is reduced by ⅓ as compared with a case without mutual inductance. Similarly, in FIG. 13B, because of the mutual inductance, the negative sequence noise current in the inductor is also reduced by ⅓. As a result, the inductance is increased by 50% for both positive and negative sequence noise. That is, $$V_1^+ = V_{LC1}^+ + V_{M2}^+ + V_{M3}^+ \tag{55}$$
$$= j\omega L_C I_1^+ - j\omega \frac{L_C}{2} I_2^+ - j\omega \frac{L_C}{2} I_3^+ = j\omega\left(\frac{3}{2}L_C\right) I_1^+$$

$$V_1^- = j\omega\left(\frac{3}{2}L_C\right) I_1^- \tag{56}$$

The same effects are present in the other two inductors. Because the sum of positive and negative sequence noise is DM noise, the inductance and DM impedance are also increased by 50%. That is, $$Z_{DM1} = \frac{V_1^+ + V_1^-}{I_1^+ + I_1^-} = j\omega\left(\frac{3}{2}L_C\right) \tag{57}$$

The increased impedance $|3Z_{LC}/2|$ should be much larger than 50Ω to achieve a high DM input impedance.

Because the three inductors are, ideally, balanced, the DM voltage excitation at center point C of FIG. 11 is zero. The DMRR is therefore $-\infty$ dB. In a practical embodiment where some degree of imbalance is unavoidable, the three inductors should be as balanced as possible.

For good CM separation in the circuit of FIG. 11, the inductors should have an inductance, $L_C$, large enough that $|3Z_{LC}/2|$ is much larger than 50Ω for DM noise within the frequency range of interest. A suitably large DM impedance also is of assistance in obtaining an input impedance of 50Ω for DM noise. Further, the three inductors should be as balanced as possible and the coupling coefficient should be as close to −0.5 as possible. The impedance of the leakage inductance between two windings should be much smaller than 50Ω. These conditions guarantee that the CM separator will have a good CMTR and DMRR.

Figure 16:
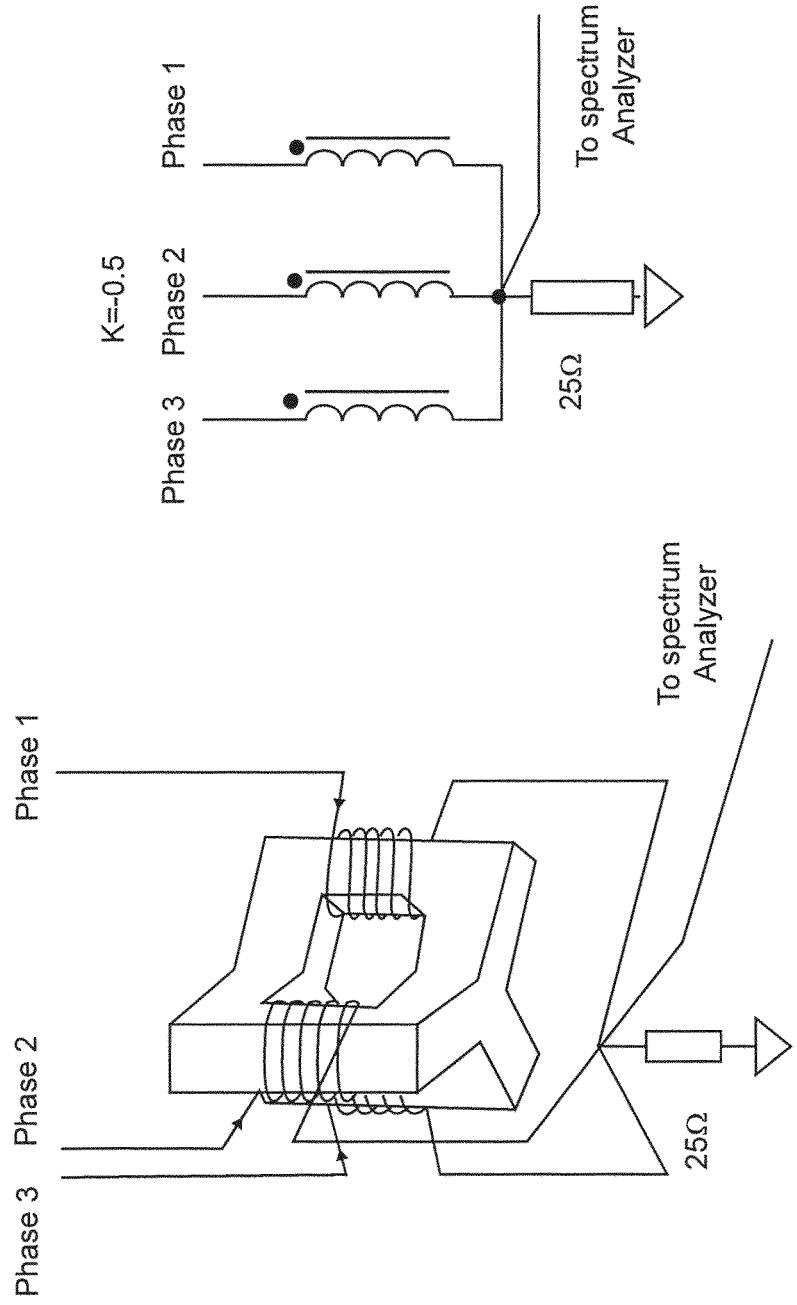
FIG. 16 illustrates a coupled three-phase coupled inductor structure with a coupling coefficient of −0.5 and its equivalent circuit suitable for performing CM noise separation in accordance with the invention.

A first exemplary method to provide suitable coupled inductors for the CM separation unit is to use a core having a number of symmetrical legs equal to the number of phases (e.g. three legs for a three-phase CM separator) and to provide a winding for a respective phase on each such leg. A suitable structure and its equivalent circuit are illustrated in FIG. 16. The coupling coefficient between any two windings is −0.5. While such a structure is straightforward in concept, it is difficult to manufacture due to the geometry of the core. Use of a planar so-called EE core which is of simplified geometry and often used in other applications is not as suitable because the reluctances of the three inductors will not be balanced.

Figure 17:
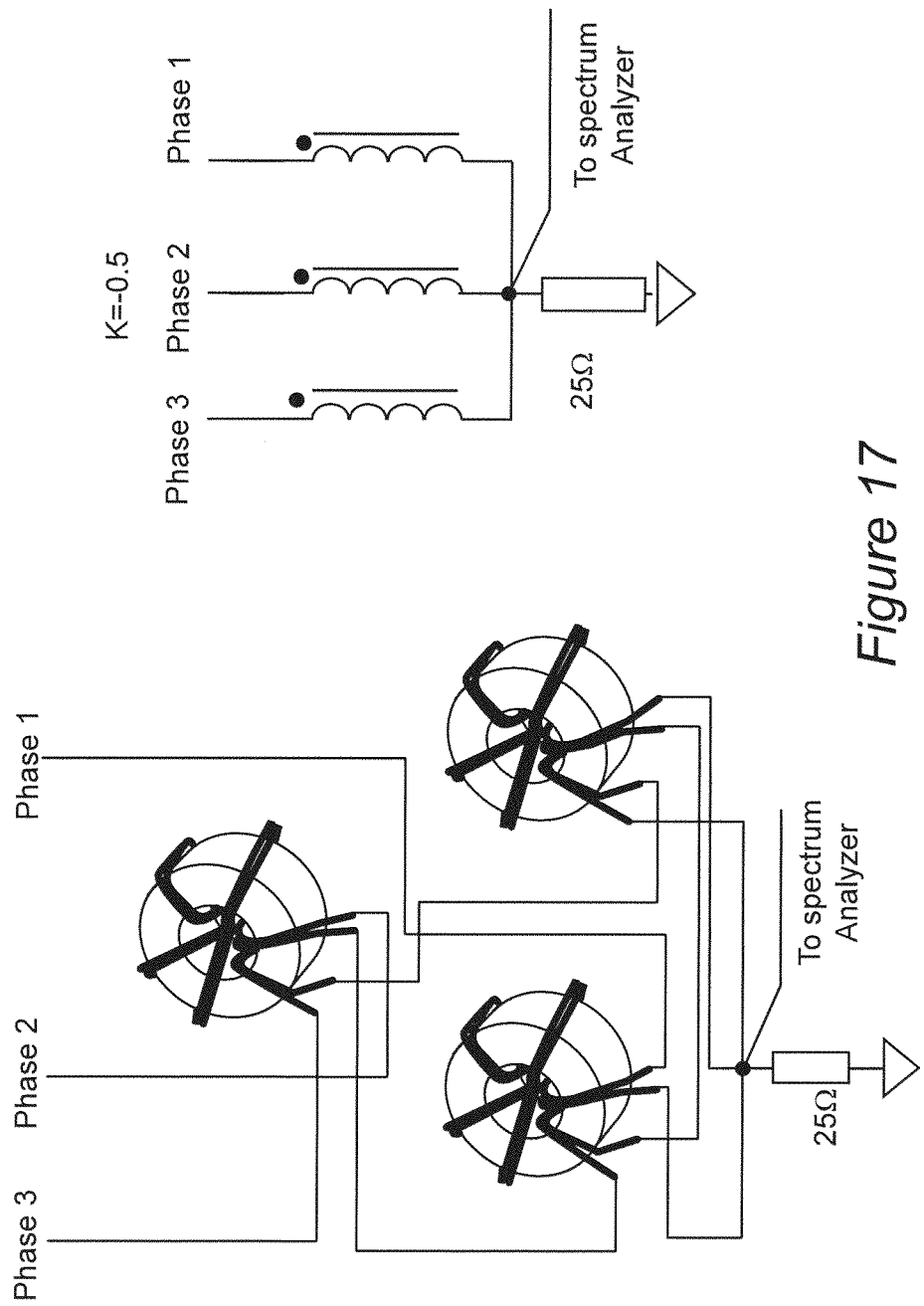
FIG. 17 illustrates an alternative coupled three-phase coupled inductor structure with a coupling coefficient of −0.5 and its equivalent circuit suitable for performing CM noise separation in accordance with the invention.
Figure 19:
FIG. 19 illustrates a prototype three-phase noise separator in accordance with the invention, FIG. 20 graphically illustrates magnitude and phase of input impedances for different noise source impedances.

A second, more practical exemplary method of forming suitable coupled inductors for a CM separator of three phases and its equivalent circuit is illustrated in FIG. 17. In this alternative, exemplary structure three identical toroidal cores are used. Each inductor has two windings on two cores and which are closely coupled with one of two windings of another phase on each of the two cores with a coupling coefficient of −1. That is, the two windings of each of the three inductors are connected in such a way that the inductor $L_C$ on each phase (e.g. as illustrated in FIG. 14) includes two series windings on two different cores and these windings are inversely coupled to the other windings of other phases on respective cores as illustrated in FIG. 17. Because the inductors are identically constituted, the coupling coefficient between any two inductors is −0.5. The same type of high permeability core described above as suitable for the DM separation unit is also suitable for each of the cores of the CM separation unit. A thirty-three turn bifilar winding has been found suitable for the practice of the invention to limit leakage inductance. This three-core coupled inductor structure is preferred due to its relative ease of manufacture and was used in test of a prototype multi-phase noise separator illustrated in FIG. 19; the performance of which is discussed below.

More generally, for n-phases, there are n coupled inductors for a CM separation unit. Ideally, each inductor has a coupling coefficient of −1/(n−1) with the other n−1 inductors respectively although, as a practical matter, construction of n inductors with a −1/(n−1) coupling coefficient is difficult. However, it is possible to use n(n−1)/2 inductors, each having two closely coupled windings with a coupling coefficient of −1. Each of the original/ideal inductors is composed of n−1 identical windings in series with each of the n−1 windings is coupled to a winding of the other n−1 phases with a coupling coefficient of −1. In other words, any inductor is shared by two phases and each phase has one winding and is electrically equivalent to n inductors having a −1/(n−1) coupling coefficient.

Figure 18:
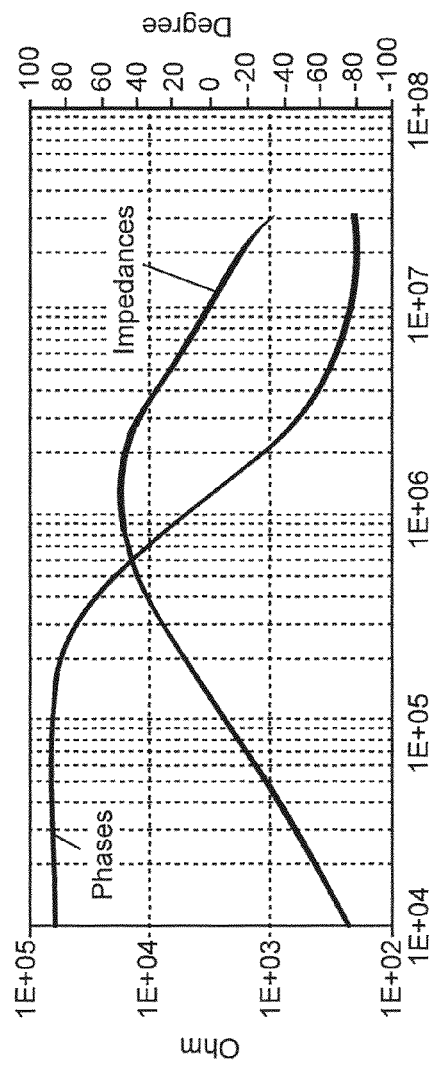
FIG. 18 is a graph of measured impedance $Z_{LC}$ for the CM separation inductors.

The measured inductance of the three inductors is substantially identical and is graphically illustrated in FIG. 18. The impedance, $|3Z_{LC}/2|$, is about 375Ω at 10 KHz and thus is much larger than 50Ω even at a frequency well beyond the frequency range for which this particular coupled inductor embodiment was designed. (As used throughout this specification, the language "much larger" or "much smaller" should be understood to mean a difference by a factor of 7-8 or more.) As with the DM separation unit, this impedance can be increased by increasing the number of turns of each winding on each core with similar possible compromise of high frequency performance. Also, as with the DM separation unit, a good solution to provide coverage of an extremely wide frequency range is to provide two or more coupled inductors that can be electrically substituted for each other to cover respective frequency ranges. (The embodiment with thirty-three turns is adapted for the 150 KHz to 30 MHZ frequency range.) As with the DM separator discussed above, more than one such electrically interchangeable CM noise separator having different inductors and covering different frequency bands may be provided and such electrically interchangeable CM separator(s) are illustrated by dots in FIG. 14. The measured coupling coefficient between two windings is 0.99997 and thus the leakage inductance is very small and the coupling coefficient between two inductances, $L_C$, is very close to −0.5. (To guarantee the coupling coefficient is sufficiently close to −0.5 for the whole coupled inductor, each winding should have a −1.0 coupling with each other winding of the other inductors of the coupled inductor. The inductors formed as illustrated in FIG. 17 and as discussed above therefore meet the conditions indicated for the CM separation unit.

Inserting the CM and DM separation units thus embodied into the schematic diagram of Figure of FIG. 8 yields the complete noise separator in accordance with the invention as schematically illustrated in FIG. 14 by connecting the inputs of the respective DM and CM separators in accordance with the invention to the multi-phase inputs and connecting their output in parallel to respective inputs to a spectrum analyzer. As indicated above, the DM noise separation unit can conduct DM noise to a 50Ω load without attenuation while presenting an extremely high impedance to CM noise, Conversely the CM noise separation unit can conduct CM noise to a 50Ω load without attenuation while presenting an extremely high impedance to DM noise. Because the inputs of the CM and DM noise separation units are connected in parallel and any noise can be decoupled into CM and DM noise components, the input impedance for any noise is therefore 50Ω and, at the same time, the separator can separate the CM and DM noise for each phase.

Performance Evaluation of Prototype

In the following discussion of measured performance of a prototype multi-phase noise separator in accordance with the invention as described above, the S-parameters of each of the separation parts, CM, DM1 (phase 1 DM), DM2 (phase 2 DM), and DM3 (phase 3 DM) are first separately measured using an Agilent E5070B network analyzer. Based on the measurement results, the prototype noise separator is evaluated using the characterization of multi-phase noise separator requirements discussed above and the CMTR, CMRR, DMTR$^+$, DMRR$^+$, DMTR$^-$ and DMRR$^-$ are evaluated. Finally, the prototype noise separator is used for noise measurement in a practical three-phase power electronics circuit.

Due to the frequency range limitation of the network analyzer, the S-parameters are measured from 300 KHZ to 30 MHZ. When the S-parameters of one of the separation parts is measured, the other separation parts are terminated with 50Ω resistances so that the reflection coefficients of those ports are zero and have no effect on the measurement.

Figure 20:
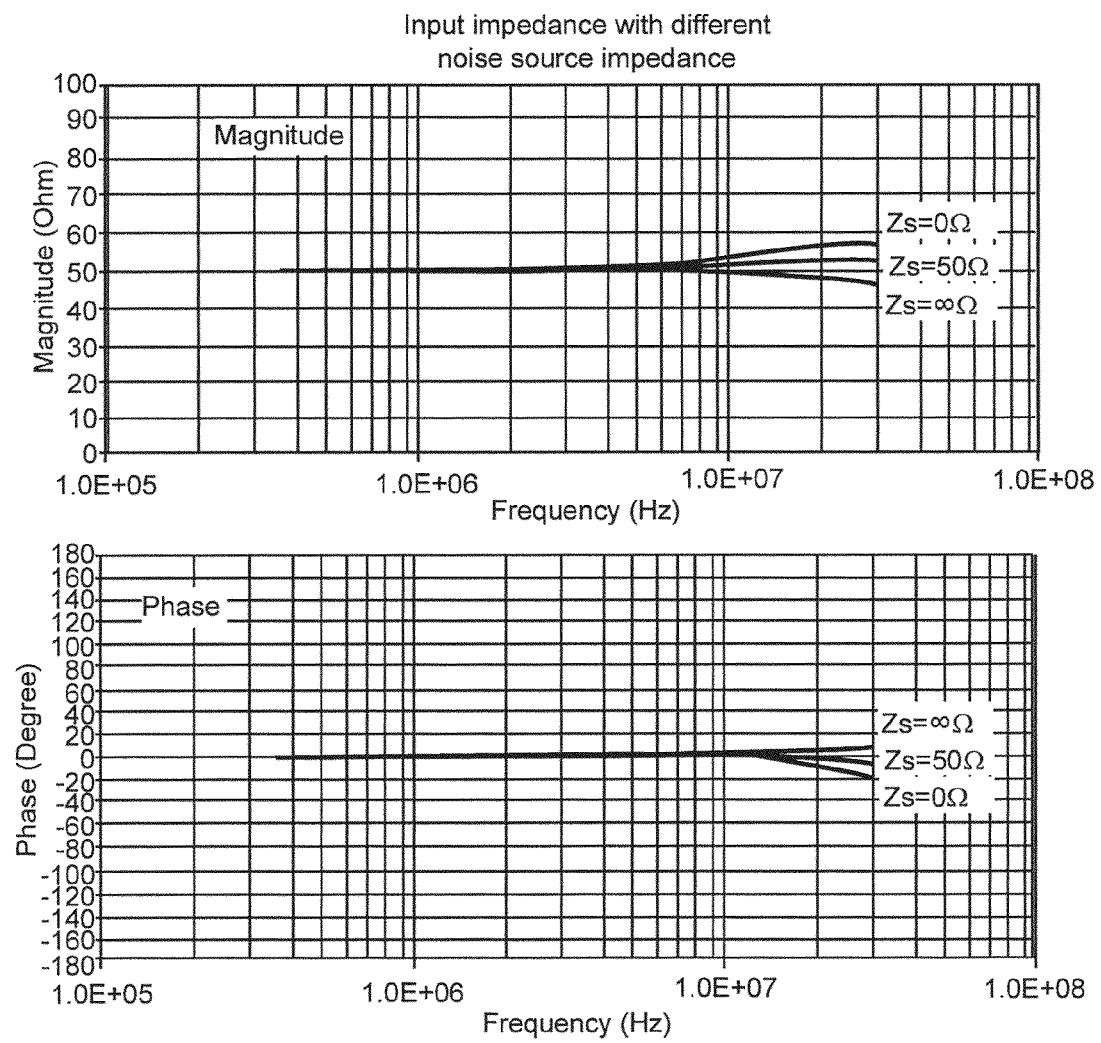

FIG. 20 graphically illustrates the magnitude and phase for the input impedance an exemplary one of the three input phases of the prototype noise separator for zero, 50Ω and infinite noise source impedances. The input impedance is seen to be independent of noise source impedance both in magnitude and phase to well above 10 MHZ and to be within the range of 45Ω-55Ω and within the phase range of −20° to +10° to 30 MHZ. Thus all input ports are able to provide a real 50Ω impedance over a wide range of frequency and are effectively noise source impedance independent.

Figure 21:
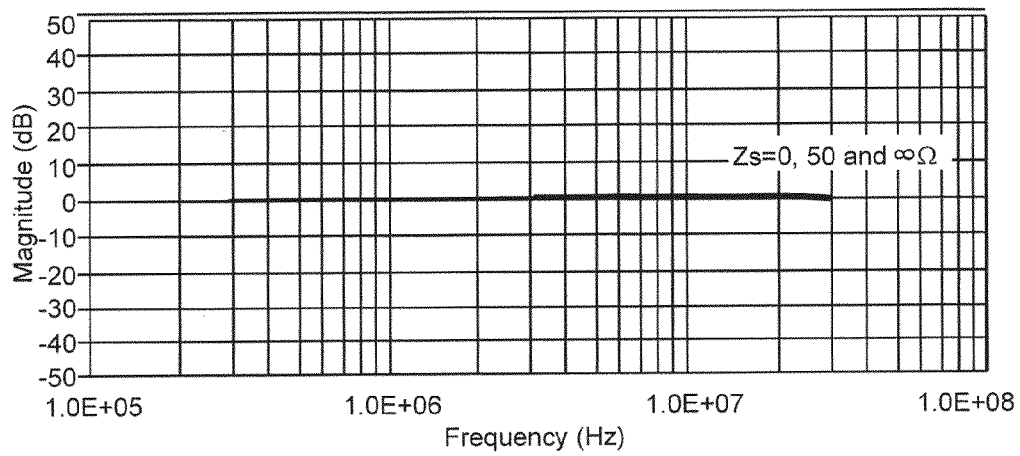
FIG. 21 is a graph illustrating the Common mode transmission ratio (CMTR) of the noise separator for different input noise impedances, FIG. 22 contains graphs of the positive and negative sequence differential mode reflection ratios (DMRR+ and DMRR−) of the CM separator for different noise source impedances.

FIG. 21 graphically illustrates the CMTR of the CM noise separation part of the prototype noise separator in accordance with the invention. The measured CMTR is very close to the ideal 0 dB over the entire frequency range and is also independent of noise source impedance.

Figure 22:
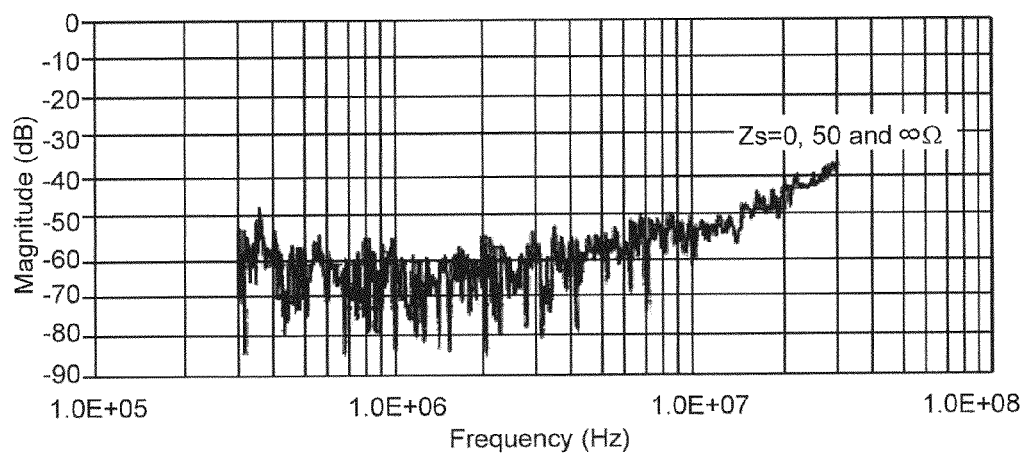
Figure 22:
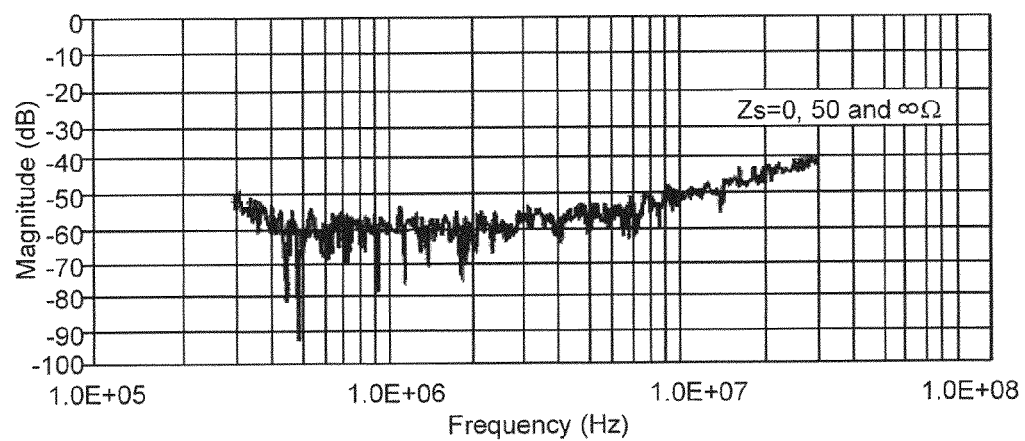
Figure 23A:
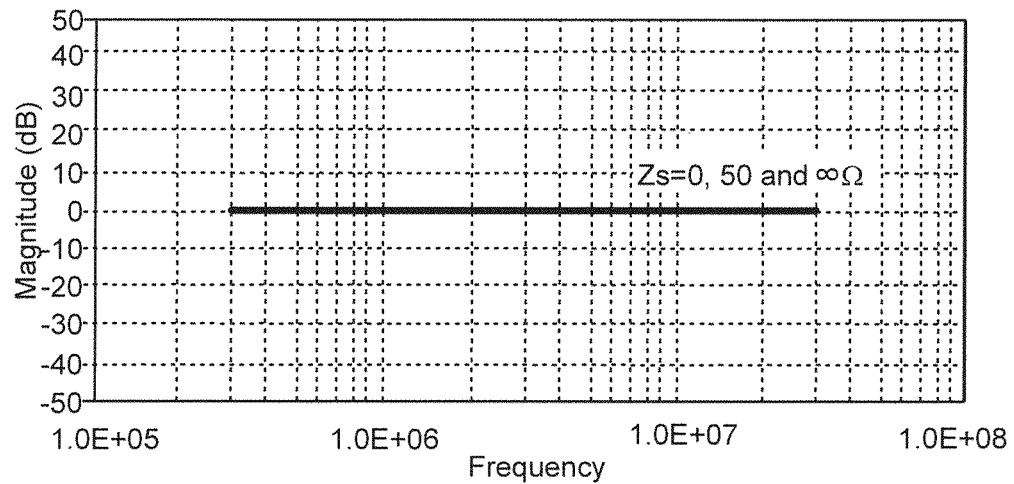
FIGS. 23A and 23B are graphs of the magnitudes of the positive and negative sequence differential mode transmission ratio (DMTR+ and DMTR−) of the exemplary DM1 noise separator for different input noise impedances.
Figure 23B:
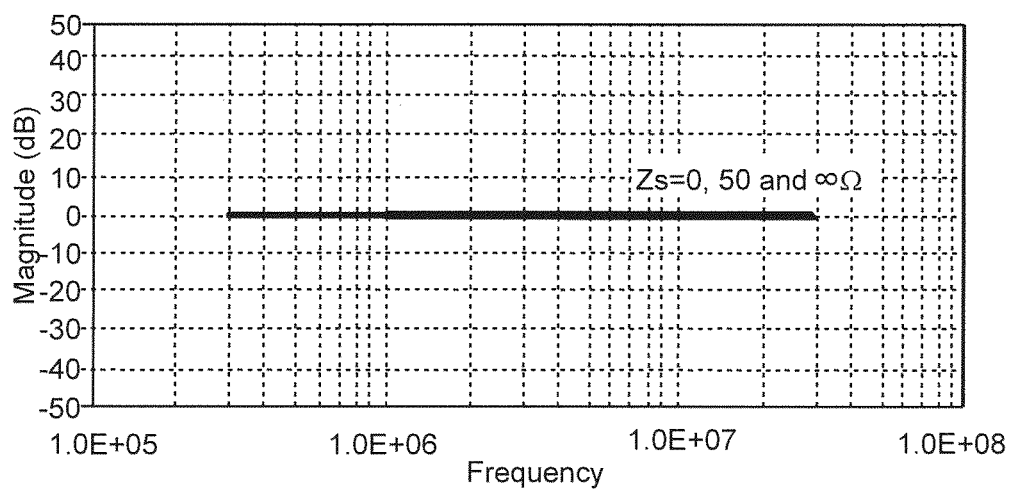
Figure 24A:
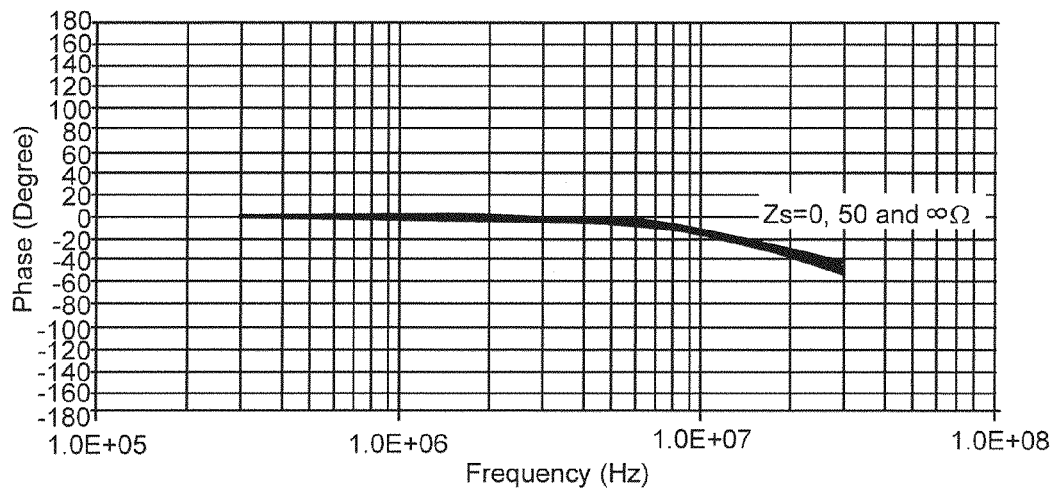
FIGS. 24A and 24B are graphs of the phase of DMTR+ and DMTR− of the DM1 noise separator for different input noise impedances.
Figure 24B:
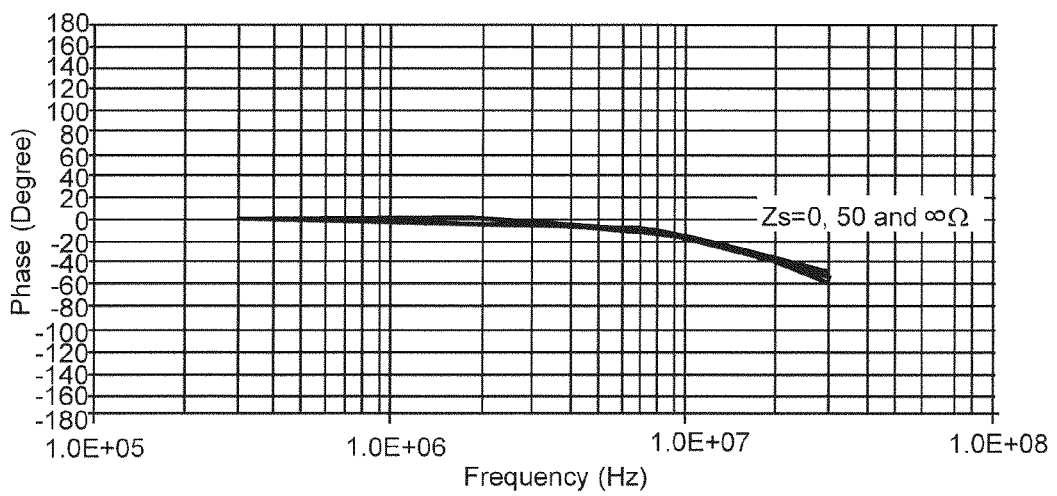

FIG. 22 graphically illustrates the measured DMTR$^+$ and DMTR$^-$ of the CM separation part of the prototype noise separator in accordance with the invention in the upper and lower graphs thereof, respectively. Again, the DMRR$^+$ and DMRR$^-$ of the CM separation part are seen to be independent of noise source impedance. While the DMRR$^+$ and DMRR$^-$ of the CM separation part should be as small as possible as alluded to above, both the DMRR$^+$ and DMRR$^-$ are below −40 dB which is considered to be quite satisfactory performance.

FIGS. 23A, 23B, 24A and 24B graphically illustrate the magnitude and phase, respectively, of the DMTR$^+$ and DMTR$^-$ of the DM1 separation part of the prototype noise separator in accordance with the invention for zero, 50Ω and substantially infinite noise source impedance. The DMTR$^+$ and DMTR$^-$ of the DM separation part are substantially the ideal 0 dB over the entire measured frequency range and the phase angle is substantially constant. Both magnitude and phase are independent of noise source impedance. For these reasons, the positive and negative noise sequences can be accurately combined into DM noise voltage at the outputs of the noise separator.

Figure 25:
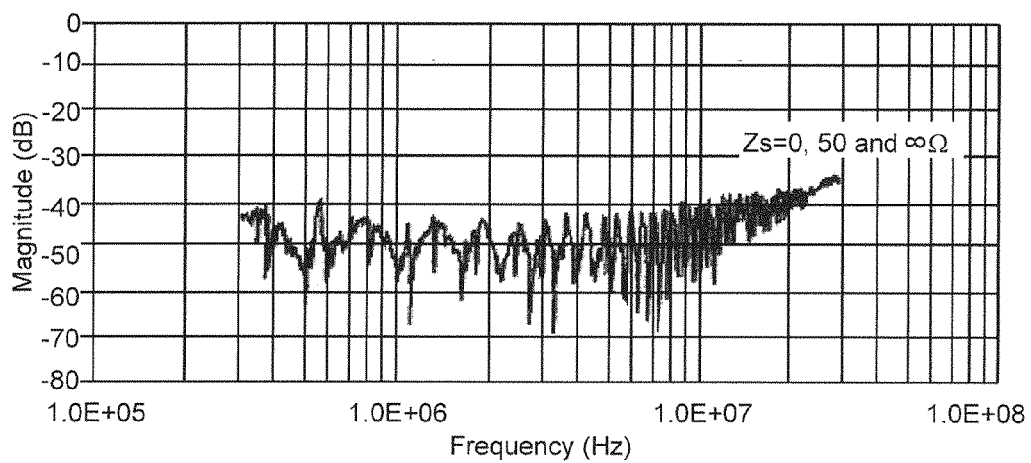
FIG. 25 is a graph of the common mode reflection ratio (CMRR) of the DM1 noise separation for different input noise impedances.

FIG. 25 graphically illustrates the CMRR of the DM1 separation part of the prototype noise separator in accordance with the invention. The measured CMRR for the DM2 and DM3 separation parts of the prototype are substantially the same as that shown for DM1. While CMRR should be as small as possible, it is below −34 dB which is considered satisfactory to support optimal EMI filter design.

Figure 26:
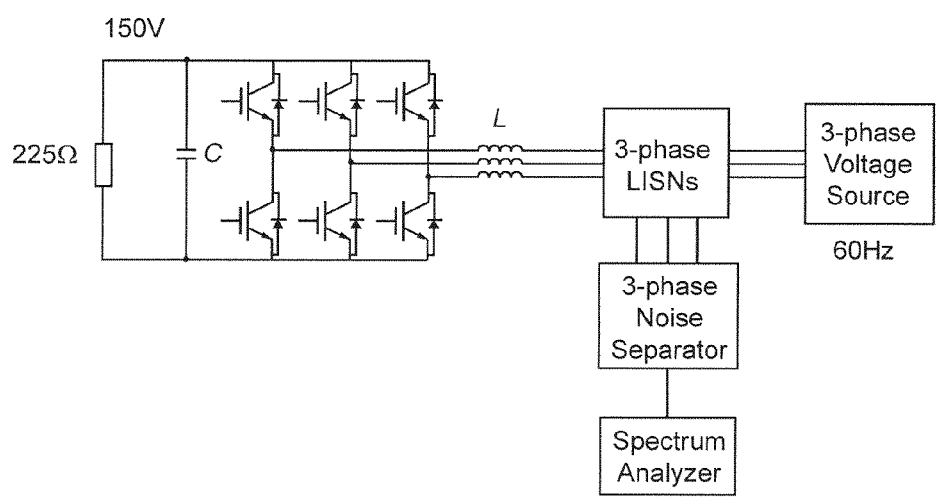
FIG. 26 is a schematic diagram of the measurement set up used for CM and DM measurement using the CM and DM EMI noise separator in accordance with the invention.

The prototype noise separator in accordance with the invention, as described above, has also been used to measure the DM and CM noise of a practical three-phase switched power electronics system. The measurement set up is schematically illustrated in FIG. 26. In this set up, a three-phase 60 Hz voltage source feeds power to a three-phase integrated gate bipolar transistor (IGBT) rectifier which supplies power to a 225Ω resistive load at 150 volts. Three-phase LISNs are inserted between the 60 Hz voltage source and the IGBT rectifier and are directly connected to the inputs of the prototype noise separator in accordance with the invention. The output of the noise separator is connected to 50Ω input of a spectrum analyzer. Unconnected outputs of prototype noise separator are terminated with 50Ω terminations. The CM and peak nose voltage was measured from 150 KHz to 30 MHZ with a resolution bandwidth of 9 KHz.

Figure 27:
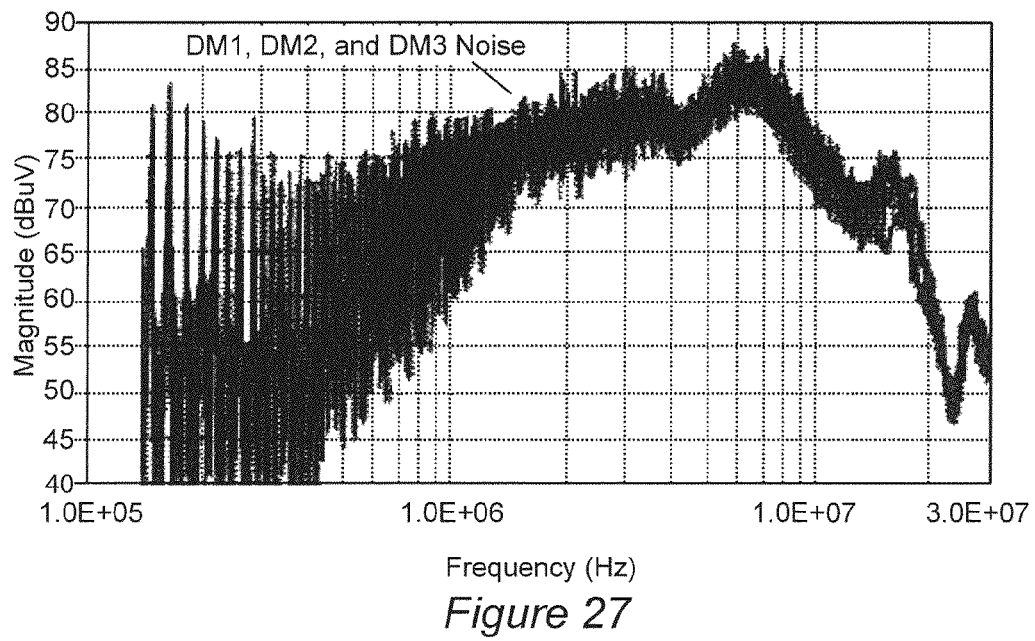
FIGS. 27 and 28 are measured spectra of DM and CM EMI noise components, respectively, for a three-phase voltage convertor of power supply which were made using the invention.
Figure 28:
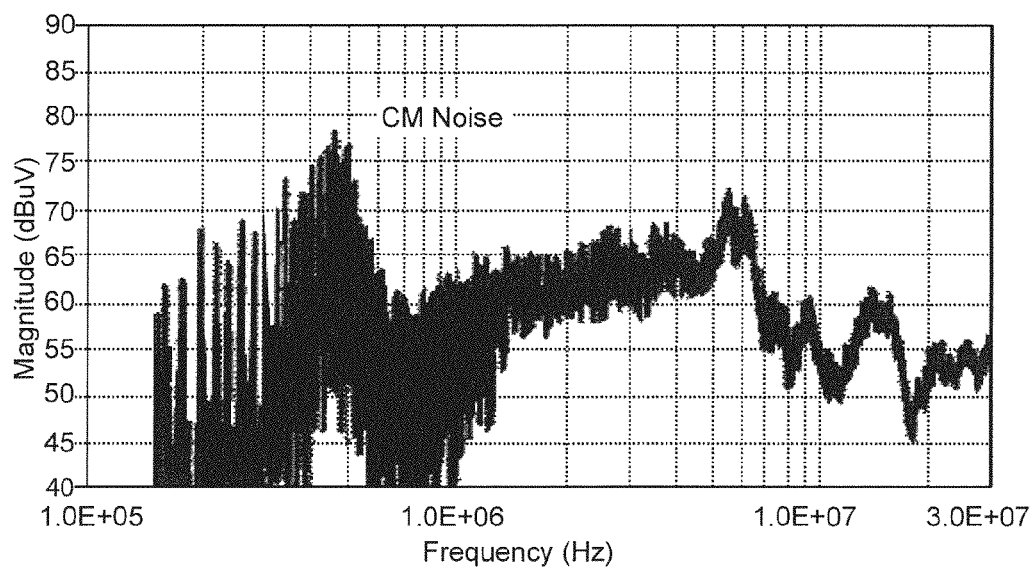

The measurement results using this set up are shown in FIGS. 27 and 28. DM noise is found to be dominant from 150 KHz to 4 MHZ and from 5 MHz to 22 MHZ from 4 MHz to 5 MHz and from 22 MHz to 30 MHZ CM noise is comparable to CM noise Based on these measurements and corresponding EMI noise standards, DM and CM EMI noise filters can easily be optimized with higher power densities (e.g. smaller volumes for a given power capacity) and low cost than can be designed without measurements of separated CM and DM noise.

In view of the foregoing, it is clearly seen that the invention provides an effective and accurate separation of CM and DM noise that supports and facilitates much improved EMI filter design which can be achieved at reduced cost; a capability that has not existed prior to the present invention. The CM and DM noise components can be separated and transferred to a spectrum analyzer or other load with no significant attenuation by the CM and DM separation units which are of relatively simple construction while DM noise components are effectively blocked by the CM separation unit and CM noise components are effectively blocked by the parallel-connected DM separator which also effectively and accurately combines the positive and negative sequence voltages into DM noise. Further, a 50Ω input impedances are provided for all noise on all inputs of the noise separator and all noise separation functions are substantially independent of noise source impedance. The underlying principles of the invention can extend embodiments of the invention to any number of phases and the noise separator in accordance with the invention can be applied to any multi-phase electrical or electronic device.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A multi-phase noise separator capable of substantially separating common mode (CM) and differential mode (DM) noise components, said noise separator comprising
   a CM noise separation unit capable of developing a high input impedance to DM noise components on connections of at least three different phases and passing CM noise, substantially without attenuation, to an output, and
   a DM noise separation unit capable of developing a high input impedance to CM noise components on connections of at least three different phases and passing DM noise, substantially without attenuation, to respective other outputs, wherein inputs of said CM separation unit and said DM separation unit are connected in parallel.

2. A multi-phase noise separator as recited in claim 1, wherein the number of phases is three.

3. A multi-phase noise separator as recited in claim 1, wherein said DM noise separation unit includes a number of coupled inductor windings having inputs connected in parallel, said inductor windings being balanced and wound on a core such that the magnetic flux in said core that is generated by current in any inductor winding cancels the magnetic flux in said core generated by currents in other inductor windings.

4. A multi-phase noise separator as recited in claim 1, wherein said DM separation unit includes a multi-phase balanced coupled inductor having an inductance and an impedance of substantially zero to DM noise currents.

5. A multi-phase noise separator as recited in claim 1, wherein said DM separation unit includes a multi-phase coupled inductor having a number of windings equal to the number of phases and having a coupling coefficient substantially equal to one.

6. A multi-phase noise separator as recited in claim 1, wherein said DM separation unit includes a multi-phase coupled inductor comprising a plurality of coupled inductor windings on a core, said plurality of inductor windings on said core being n-filar windings.

7. A multi-phase noise separator as recited in claim 6, wherein each of said n-filar windings are of thirty turns.

8. A multi-phase noise separator as recited in claim 1, wherein said DM separation unit includes at least two electrically interchangeable multi-phase coupled inductors, each electrically interchangeable multi-phase coupled inductor comprising a plurality of coupled inductor windings on a core, said plurality of coupled inductor windings on said core being n-filar windings, said n-filar windings of respective ones of said at least two electrically interchangeable multi-phase coupled inductors having different spacings between conductors of said n-filar windings.

9. A multi-phase noise separator as recited in claim 1, wherein said CM separation unit includes a multi-phase inductor comprising a plurality of coupled inductors equal to $n(n-1)/2$, of the plurality of coupled inductors where n is the number of phases, one terminal of each being connected to a respective phase and another terminal of each of the plurality of coupled inductors being connected to a common node.

10. A multi-phase noise separator as recited in claim 1, wherein at least one of said CM noise separation unit and said DM noise separation unit includes a multi-phase inductor comprising coupled inductors, and wherein n is the number of phases and a coupling coefficient between any two coupled inductors of said multi-phase inductor of said CM separation unit is approximately $-1/(n-1)$.

11. A multi-phase noise separator as recited in claim 1, wherein said CM noise separation unit includes a multi-phase inductor and wherein said multi-phase inductor of said CM separation unit comprises a plurality of inductor windings on respective legs of a core, said core being configured such that the reluctances of the plurality of inductor windings will be substantially balanced.

12. A multi-phase noise separator as recited in claim 1, wherein said CM noise separation unit includes a multi-phase inductor and wherein said multi-phase inductor of said CM separation unit comprises a plurality of cores and an inductor winding for each phase which comprises two series windings on two respective cores which are closely coupled with one of two series windings of two other phases.

13. A multi-phase noise separator as recited in claim 12, wherein a coupling coefficient between any two of said inductor windings is $-1/(n-1)$.

14. A multi-phase noise separator as recited in claim 1, wherein said CM separation unit comprises at least two electrically interchangeable multi-phase coupled inductors, said at least two electrically interchangeable multi-phase coupled inductors having windings of different inductances.

15. A multi-phase noise separator as recited in claim 14, wherein one of said at least two multi-phase inductors of said CM separation unit includes windings of thirty-three turns each.

16. A multi-phase noise separator as recited in claim 1, wherein said CM noise separation unit includes a multi-phase inductor and wherein said multi-phase inductor of said CM separation unit includes windings of thirty-three turns each.

* * * * *